(12) United States Patent
Lee

(10) Patent No.: US 12,588,192 B2
(45) Date of Patent: Mar. 24, 2026

(54) SEMICONDUCTOR DEVICE

(71) Applicant: SAMSUNG ELECTRONICS CO., LTD., Suwon-si (KR)

(72) Inventor: Kiseok Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 351 days.

(21) Appl. No.: 18/219,229

(22) Filed: Jul. 7, 2023

(65) Prior Publication Data

US 2024/0098985 A1     Mar. 21, 2024

(30) Foreign Application Priority Data

Sep. 15, 2022     (KR) ........................ 10-2022-0116631

(51) Int. Cl.
H10B 12/00          (2023.01)
(52) U.S. Cl.
CPC ........... H10B 12/485 (2023.02); H10B 12/05 (2023.02); *H10B 12/315* (2023.02); *H10B 12/34* (2023.02)
(58) Field of Classification Search
CPC ........ H10B 12/03; H10B 12/05; H10B 12/09; H10B 12/315; H10B 12/34; H10B 12/36; H10B 12/482
See application file for complete search history.

(56) References Cited

U.S. PATENT DOCUMENTS

| | | | |
|---|---|---|---|
| 8,378,499 B2 | 2/2013 | Hasunuma | |
| 9,214,382 B2 | 12/2015 | Lee et al. | |
| 9,230,612 B2 | 1/2016 | Park | |
| 10,685,963 B2 | 6/2020 | Lee et al. | |
| 11,411,010 B2 | 8/2022 | Seong et al. | |
| 2022/0037330 A1 | 2/2022 | Huang et al. | |
| 2023/0189504 A1* | 6/2023 | Park | H10B 12/485 |
| | | | 257/296 |

FOREIGN PATENT DOCUMENTS

| | | |
|---|---|---|
| CN | 111640749 A | 9/2020 |
| KR | 10-2014-0028910 A | 3/2014 |
| KR | 10-2015-0012943 A | 2/2015 |
| KR | 10-2019-0131885 A | 11/2019 |
| KR | 10-2059863 B1 | 12/2019 |
| KR | 10-2021-0032843 A | 3/2021 |
| KR | 10-2021-0158258 A | 12/2021 |

* cited by examiner

*Primary Examiner* — Hoai V Pham

(74) *Attorney, Agent, or Firm* — Muir Patent Law, PLLC

(57)     ABSTRACT

A semiconductor device includes a substrate having at least one active region, the at least one active region being defined by an isolation layer, at least one word line extending in a first horizontal direction inside the substrate, the at least one word line crossing the at least one active region, at least one bit line extending in a second horizontal direction orthogonal to the first horizontal direction, the at least one bit line being at a higher vertical level than the at least one word line, and at least one direct contact electrically connecting the at least one bit line to the at least one active region, the at least one direct contact having a maximum width in a third horizontal direction, the third horizontal direction intersecting each of the first horizontal direction and the second horizontal direction at an acute angle.

20 Claims, 27 Drawing Sheets

II-II'

III–III'

III–III'

III-III'

III-III'

III–III'

III–III'

III–III'

III-III'

1

SEMICONDUCTOR DEVICE

CROSS-REFERENCE TO RELATED APPLICATION

This application is based on and claims priority under 35 U.S.C. § 119 to Korean Patent Application No. 10-2022-0116631, filed on Sep. 15, 2022, in the Korean Intellectual Property Office, the disclosure of which is incorporated by reference herein in its entirety.

BACKGROUND

1. Field

Embodiments relate to a semiconductor device, and more particularly, to a semiconductor device including a direct contact.

2. Description of the Related Art

Along with the rapid development of the electronics industry and the demands of users, electronic devices have been gradually made small and lightweight. Therefore, because a semiconductor device having a high degree of integration to be used for electronic devices is demanded, the design rules for components of a semiconductor device have decreased. Accordingly, the difficulty of a manufacturing process of increasing a contact area between conductive patterns constituting a semiconductor device has gradually increased.

SUMMARY

According to an aspect of embodiments, there is provided a semiconductor device including a substrate having an active region defined by an isolation layer, a word line extending in a first horizontal direction inside the substrate and crossing the active region, a bit line extending in a second horizontal direction orthogonal to the first horizontal direction at a higher vertical level than the word line, and a plurality of direct contacts electrically connecting the bit line to the active region, wherein each of the plurality of direct contacts has a maximum width in a third horizontal direction intersecting at an acute angle with each of the first horizontal direction and the second horizontal direction.

According to another aspect of embodiments, there is provided a semiconductor device including a substrate, an isolation layer defining an active region in the substrate, a word line dividing the active region into a first impurity region and a second impurity region while crossing the active region in a first horizontal direction, a bit line extending on the substrate in a second horizontal direction orthogonal to the first horizontal direction, and a direct contact electrically connecting the bit line to the first impurity region, wherein the direct contact has a long axis extending in a third horizontal direction intersecting with the first horizontal direction and the second horizontal direction and has a shape including a first curve and a second curve, which meet on the long axis.

According to another aspect of embodiments, there is provided a semiconductor device including a substrate, an isolation layer in the substrate, an active region including a first impurity region and second impurity regions separated from each other with the first impurity region therebetween, and defined by the isolation layer, a word line extending in a first horizontal direction inside the substrate and crossing between the first impurity region and second impurity region, a bit line extending in a second horizontal direction orthogonal to the first horizontal direction at a higher vertical level than the word line, and a plurality of direct contacts electrically connecting the bit line to the first impurity region, wherein the direct contact has a maximum width in a third horizontal direction intersecting at an acute angle with each of the first horizontal direction and the second horizontal direction, and the first impurity region has a maximum width in the third horizontal direction.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1A:
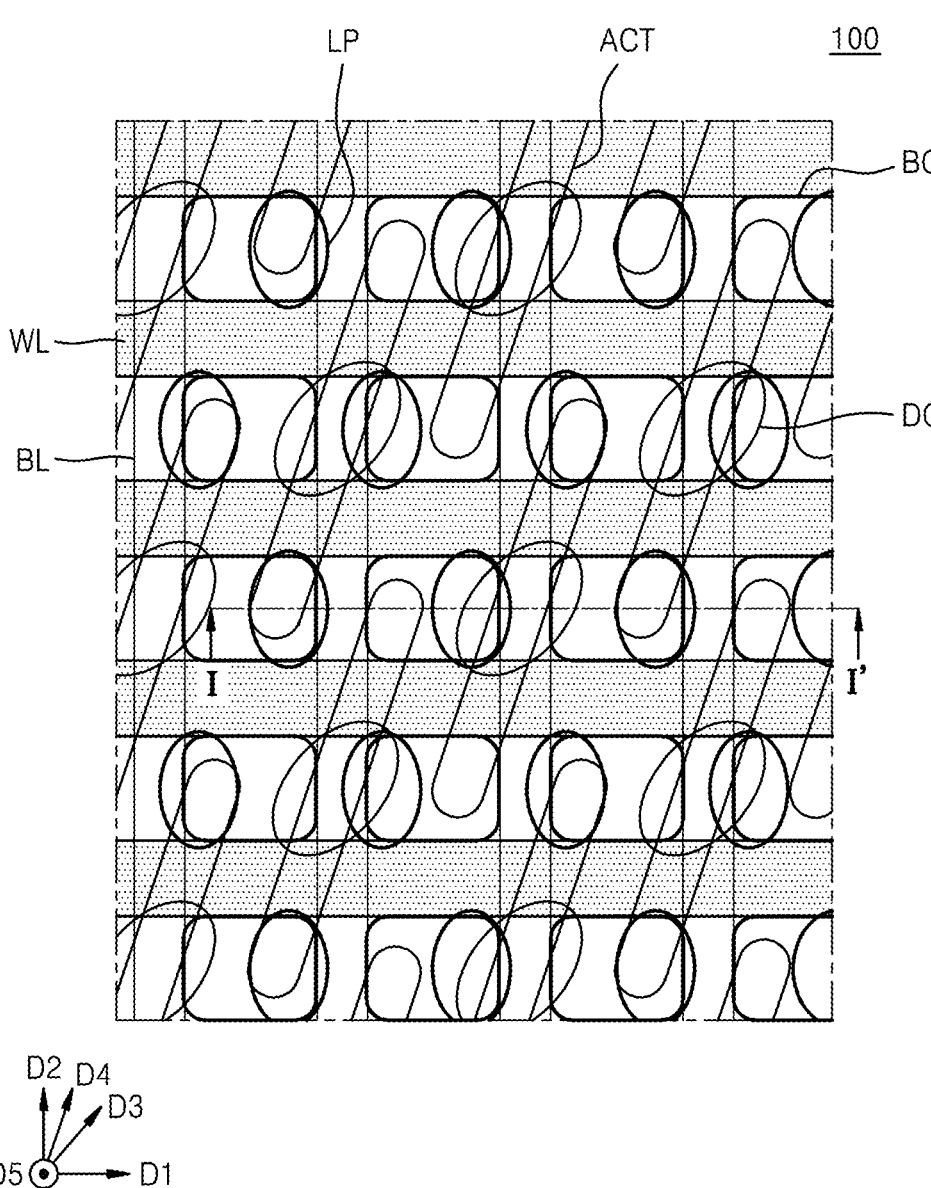
FIG. 1A is a layout diagram illustrating main components of a semiconductor device according to embodiments.
Figure 1B:
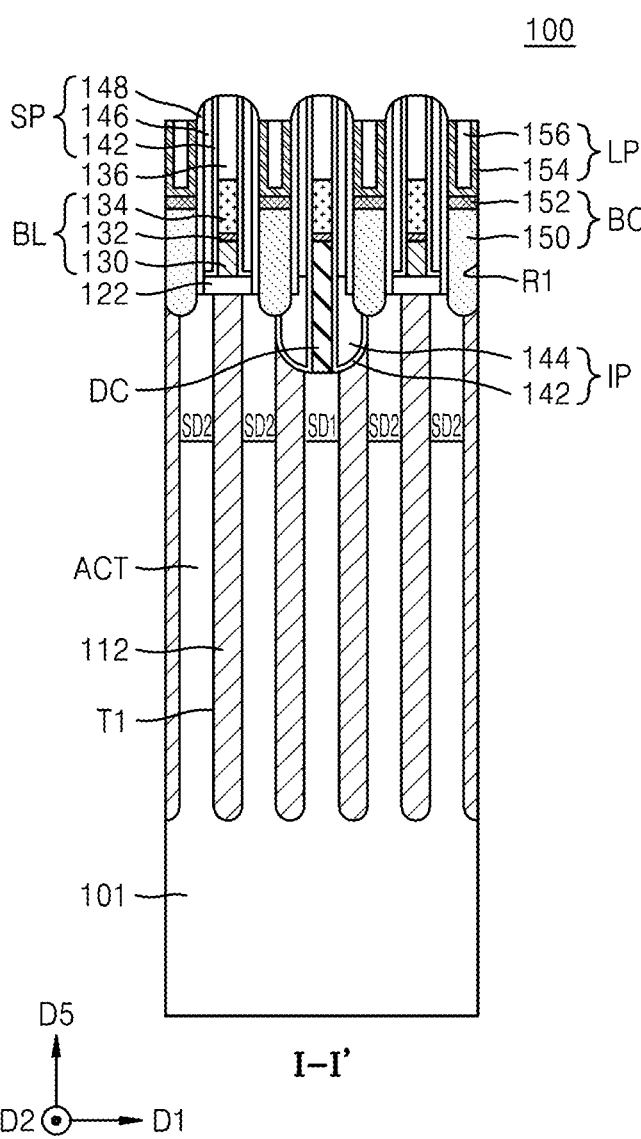
FIG. 1B is a cross-sectional view taken along line I-I' of FIG. 1A to describe the semiconductor device according to embodiments.

FIG. 1A is a layout diagram illustrating main components of a semiconductor device 100 according to embodiments. FIG. 1B is a cross-sectional view taken along line I-I' of FIG. 1A.

Referring to FIG. 1A, the semiconductor device 100 may include a plurality of active regions ACT horizontally extending in a diagonal direction with respect to a first horizontal direction D1 and a second horizontal direction D2 in a top view. In some embodiments, the plurality of active regions ACT may extend in a fourth horizontal direction D4. It is noted that hereinafter a "horizontal direction" refers to a direction parallel to a top surface of a substrate, and an element that extends horizontally in "a diagonal direction" extends in parallel to the top surface of the substrate while extending at an oblique angle with respect to any of the edges of the substrate. A "vertical" direction or level refers to a direction or distance along a direction normal or perpendicular to the top surface of the substrate.

A plurality of word lines WL may extend in parallel to each other in the first horizontal direction D1 and cross the plurality of active regions ACT. Above the plurality of word lines WL, a plurality of bit lines BL may extend in parallel to each other in the second horizontal direction D2 intersecting with the first horizontal direction D1.

The plurality of bit lines BL may be connected to the plurality of active regions ACT via a plurality of direct contacts DC. In some embodiments, a plurality of buried contacts BC may be formed between two adjacent bit lines BL among the plurality of bit lines BL. Each of the plurality of buried contacts BC may extend to a top of any one of the two adjacent bit lines BL. In some embodiments, the plurality of buried contacts BC may be arranged in a line in the first horizontal direction D1 and the second horizontal direction D2.

A plurality of landing pads LP may be respectively formed on the plurality of buried contacts BC. The plurality of buried contacts BC and the plurality of landing pads LP may connect lower electrodes of capacitors formed on the plurality of bit lines BL to the plurality of active regions ACT. The plurality of landing pads LP may partially overlap the plurality of buried contacts BC, respectively. A more detailed description of the semiconductor device 100 is made below.

Referring to FIG. 1B, the semiconductor device 100 may include a substrate 101 in which the plurality of active regions ACT are defined by an isolation layer 112.

The substrate 101 may be a wafer including silicon (Si). Alternatively, the substrate 101 may be a wafer including a semiconductor element, e.g., germanium (Ge), or a compound semiconductor, e.g., silicon carbide (SiC), gallium arsenide (GaAs), indium arsenide (InAs), or indium phosphide (InP). In addition, the substrate 101 may have a silicon on insulator (SOI) structure. In addition, the substrate 101 may include a conductive region, e.g., an impurity-doped well or an impurity-doped structure.

The isolation layer 112 may be formed in a first trench T1 formed in the substrate 101. The isolation layer 112 may include, e.g., silicon oxide, silicon nitride, or a combination thereof. In the substrate 101, the active region ACT may be defined by the isolation layer 112.

The active region ACT may be arranged in a bar shape extending in a diagonal direction with respect to the first horizontal direction D1 and the second horizontal direction D2. In detail, the active region ACT may extend in the fourth horizontal direction D4 intersecting, e.g., at an oblique angle, with the first horizontal direction D1 and the second horizontal direction D2. The active region ACT may include a first impurity region SD1 and second impurity regions SD2 separated from each other with the first impurity region SD1 therebetween, e.g., the first impurity region SD1 may be between two second impurity regions SD2 within a same active region ACT. A channel region may be formed between the first impurity region SD1 and each of the second impurity regions SD2.

In the substrate 101, the plurality of word lines WL described above with reference to FIG. 1A may be buried. A buffer layer 122 may be formed on the substrate 101. The buffer layer 122 may cover an upper surface of the isolation layer 112. For example, the buffer layer 122 may include a stacked structure of first silicon oxide, silicon nitride, and second silicon oxide sequentially formed on the substrate 101.

The plurality of bit lines BL extending in parallel to each other in the second horizontal direction D2 may be on the buffer layer 122. The plurality of bit lines BL may be separated from each other in the first horizontal direction D1. The direct contact DC may be on a partial region of each of the plurality of active regions ACT. Particularly, the direct contact DC may be on the first impurity region SD1 of each of the plurality of active regions ACT. Each of the plurality of bit lines BL may be connected to the active region ACT via the direct contact DC. The direct contact DC may include, e.g., tungsten (W), tungsten nitride (WN), cobalt (Co), nickel (Ni), aluminum (Al), molybdenum (Mo), ruthenium (Ru), titanium (Ti), titanium nitride (TiN), tantalum (Ta), tantalum nitride (TaN), copper (Cu), or a combination thereof. In some embodiments, the direct contact DC may include doped polysilicon. The direct contact DC will be described in more detail below.

In some embodiments, a lower conductive layer 130 may include doped polysilicon. Each of an intermediate conductive layer 132 and an upper conductive layer 134 may include a layer including Ti, TiN, titanium silicon nitride (TiSiN), W, WN, tungsten silicide (WSi), tungsten silicon nitride (WSiN), Ru, or a combination thereof. For example, the intermediate conductive layer 132 may include a TiN layer and/or a TiSiN layer, and the upper conductive layer 134 may include a layer including Ti, TiN, W, WN, WSiN, Ru, or a combination thereof. An insulating capping pattern 136 may include silicon nitride. For example, as illustrated in FIG. 1B, the lower conductive layer 130, the intermediate conductive layer 132, and the upper conductive layer 134 may be stacked on top of each other to constitute each of the plurality of bit lines BL.

In a partial region of the substrate 101, a plurality of recess spaces R1 may be formed in the active region ACT. The plurality of recess spaces R1 may be filled with a plurality of contact plugs 150, respectively. Each of the plurality of contact plugs 150 may have a pillar shape extending in a vertical direction D5 from the recess space R1. Each of the plurality of contact plugs 150 may be in contact with the active region ACT. A lower end portion of each of the plurality of contact plugs 150 may be at a lower level than an upper surface of the substrate 101 so as to be buried in the substrate 101. The plurality of contact plugs 150 may include, e.g., a metal only, a metal and a metal silicide layer, or doped polysilicon.

The plurality of contact plugs 150 may be arranged in a line in the second horizontal direction D2 between a pair of bit lines BL selected from among the plurality of bit lines BL and adjacent to each other. An insulating fence may be between every two of the plurality of contact plugs 150 arranged in a line in the second horizontal direction D2. The plurality of contact plugs 150 may be insulated from each other by the insulating fence. For example, the insulating fence may include silicon nitride. The insulating fence may have a pillar shape extending on the substrate 101 in the vertical direction D5.

A plurality of metal silicide layers 152 and the plurality of landing pads LP may be on the plurality of contact plugs 150, respectively. Each of the plurality of landing pads LP may extend lengthwise in the vertical direction D5 above the contact plug 150. Each of the plurality of landing pads LP may be electrically connected to the contact plug 150 via the metal silicide layer 152.

Each of the plurality of landing pads LP may include a conductive barrier layer 154 and a metal layer 156. In some embodiments, the conductive barrier layer 154 may include Ti, TiN, or a combination thereof, and the metal layer 156 may include W. The plurality of landing pads LP may have a pattern shape of a plurality of islands in a top view. In some embodiments, the metal silicide layer 152 may include, e.g., cobalt silicide, nickel silicide, or manganese silicide. In some embodiments, the metal silicide layer 152 may be omitted.

The contact plug 150 and the metal silicide layer 152 may constitute the buried contact BC. The contact plug 150, the metal silicide layer 152, and the landing pad LP sequentially disposed on the substrate 101 may constitute a contact structure electrically connected to the active region ACT at a position adjacent to the bit line BL in the first horizontal direction D1.

Both, e.g., opposite, side walls of each of the plurality of bit lines BL and a plurality of insulating capping patterns 136 respectively covering upper surfaces of the plurality of bit lines BL may be covered by a spacer structure SP. One spacer structure SP may be between one bit line BL selected from among the plurality of bit lines BL and the plurality of contact plugs 150 arranged in a line in the second horizontal direction D2 at a position adjacent to the one bit line BL. Each of a plurality of spacer structures SP may include an inner spacer 142, an intermediate spacer 146, and an outer spacer 148.

The inner spacer 142 may be in contact with each of a side wall of the bit line BL and a side wall of the direct contact DC. The inner spacer 142 may include a part in contact with the contact plug 150. The inner spacer 142 may include, e.g., silicon nitride.

The intermediate spacer 146 may be between the inner spacer 142 and the outer spacer 148 in the first horizontal direction D1. The intermediate spacer 146 may have a side wall facing the bit line BL with the inner spacer 142 therebetween and a side wall facing the contact plug 150, the metal silicide layer 152, and the landing pad LP with the outer spacer 148 therebetween. The intermediate spacer 146 may include, e.g., silicon oxide, an air spacer, or a combination thereof.

The outer spacer 148 may be in contact with a side wall of each of the contact plug 150, the metal silicide layer 152, and the landing pad LP. The outer spacer 148 may be separated from the inner spacer 142 with the intermediate spacer 146 therebetween. In some embodiments, the outer spacer 148 may include, e.g., silicon nitride.

The spacer structure SP may extend in parallel to the bit line BL in the second horizontal direction D2. The insulating capping pattern 136 and the spacer structure SP may constitute an insulating structure covering an upper surface and both side walls of the bit line BL.

A gap-fill pattern 144 may be between the direct contact DC and the contact plug 150. The gap-fill pattern 144 may be separated from the direct contact DC with the inner spacer 142 therebetween. The gap-fill pattern 144 may surround the direct contact DC by covering side walls of the direct contact DC. The gap-fill pattern 144 may be in contact with the inner spacer 142 and the contact plug 150. In some embodiments, the gap-fill pattern 144 may include silicon nitride. A structure including the inner spacer 142 and the gap-fill pattern 144 may be referred to as an insulating pattern IP.

Although not shown in FIG. 1B, a plurality of capacitors may respectively be on the plurality of landing pads LP. The plurality of capacitors may include a plurality of lower electrodes, a capacitor dielectric layer, and an upper electrode. The capacitor dielectric layer may cover the plurality of lower electrodes. The upper electrode may cover the capacitor dielectric layer and face the plurality of lower electrodes with the capacitor dielectric layer therebetween.

Figure 2A:
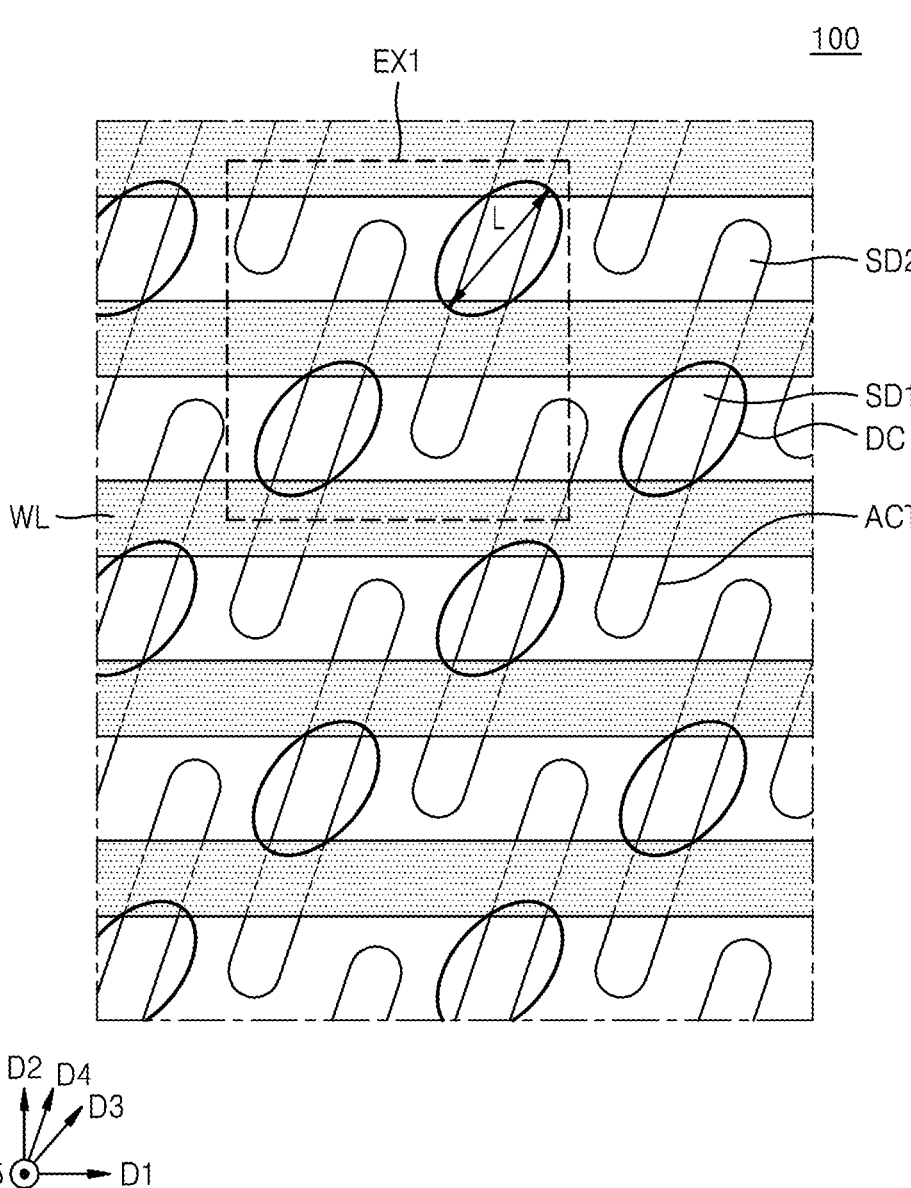
FIG. 2A is an enlarged layout diagram illustrating some components of the semiconductor device of FIG. 1A according to embodiments.
Figure 2B:
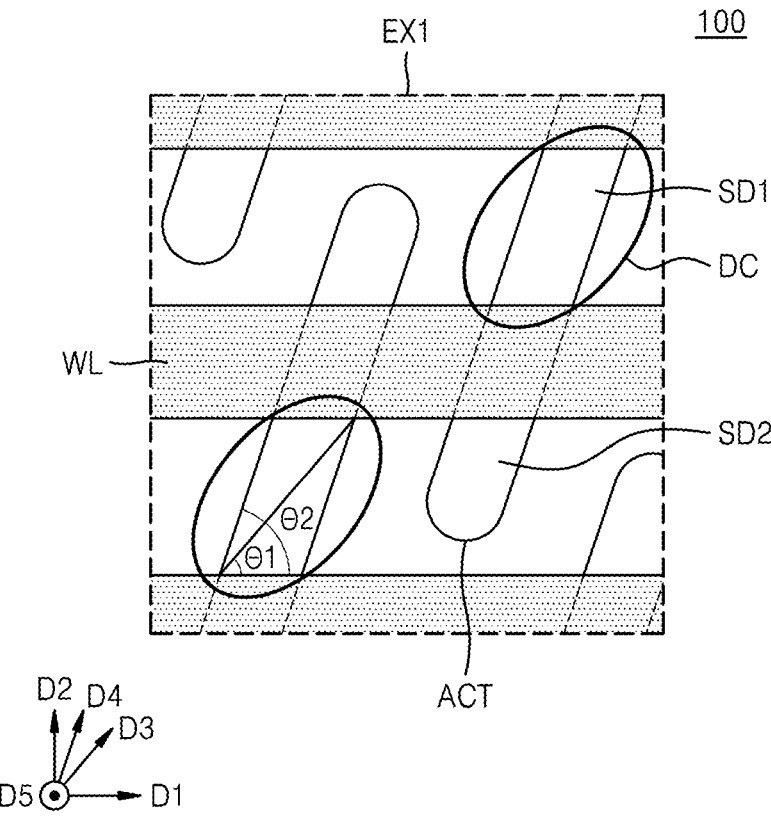
FIG. 2B is a magnified top view of a region EX1 of FIG. 2A.

FIG. 2A is an enlarged layout diagram illustrating some components of the semiconductor device 100 according to embodiments. FIG. 2B is a magnified top view of a region EX1 of FIG. 2A. FIGS. 2A and 2B show only some components for convenience of description.

Referring to FIG. 2A, the plurality of word lines WL may extend in the first horizontal direction D1 and cross the plurality of active regions ACT. The active region ACT may include the first impurity region SD1 (e.g., in a center the active region ACT) and the second impurity regions SD2 (e.g., at edges of the active region ACT) separated from each other with the first impurity region SD1 therebetween. The word line WL may divide the active region ACT into the first impurity region SD1 and the second impurity region SD2, e.g., two word lines WL may intersect each active region ACT. The first impurity region SD1 and the second impurity region SD2 may be separated from each other with the word line WL therebetween.

The direct contact DC may be electrically connected to the first impurity region SD1. Particularly, the direct contact DC may be on the first impurity region SD1 of each of the plurality of active regions ACT. That is, each of the plurality of bit lines BL may be connected to the first impurity region SD1 via the direct contact DC.

In some embodiments, the direct contact DC may have a shape long in a third horizontal direction D3, e.g., the direct contact DC may extend lengthwise in the third horizontal direction D3. That is, the direct contact DC may have a maximum width L in the third horizontal direction D3, e.g., the direct contact DC may have its longest dimension in the third horizontal direction D3. In some embodiments, a plurality of direct contacts DC may be separated from each other in a diagonal direction intersecting with the first horizontal direction D1 and the second horizontal direction D2. For example, the plurality of direct contacts DC may be separated from each other in the third horizontal direction D3, e.g., a direction at an oblique or acute angle with respect to each of the first and second directions D1 and D2. As another example, the plurality of direct contacts DC may be separated from each other in the fourth horizontal direction D4. As yet another example, the plurality of direct contacts DC may be separated from each other in another diagonal direction intersecting with the third horizontal direction D3 and the fourth horizontal direction D4.

Referring to FIG. 2B, in some embodiments, the third horizontal direction D3 in which the direct contact DC has a maximum width may be different from the fourth horizontal direction D4 in which the active region ACT extends, e.g., longitudinal directions of the direct contact DC and the active region ACT may be different from each other. In detail, when each of the third horizontal direction D3 and the fourth horizontal direction D4 intersect at an acute angle with the first horizontal direction D1 and the second horizontal direction D2, the third horizontal direction D3 may intersect at a smaller angle with the first horizontal direction D1 than the fourth horizontal direction D4 intersects with the first horizontal direction D1. For example, as illustrated in FIG. 2B, the third horizontal direction D3 may intersect at a first angle $\theta 1$ with the first horizontal direction D1, and the fourth horizontal direction D4 may be intersect at a second angle $\theta 2$ greater than the first angle $\theta 1$ with the first horizontal direction D1.

In some embodiments, the third horizontal direction D3 (in which the direct contact DC has a maximum width) may be a direction in which the first impurity region SD1 has a maximum width. In detail, the first impurity region SD1 defined by the word line WL may have a shape inclined in the fourth horizontal direction D4 like the active region ACT and have a maximum width in a horizontal direction intersecting with the fourth horizontal direction D4. For example, when the first impurity region SD1 has a shape substantially close to a parallelogram, the first impurity region SD1 may have a maximum width in a diagonal direction, and the diagonal direction may be the third horizontal direction D3 in which the direct contact DC has a maximum width. For example, referring to FIG. 2B, while the entirety of the active region ACT is inclined at the second angle θ2 with respect to the first horizontal direction D1 (i.e., in the fourth horizontal direction D4), both the direct contact DC and the first impurity region SD1 may have shapes with maximum widths inclined at the first angle θ1 with the first horizontal direction D1 (i.e., in the third horizontal direction D3). For example, as further illustrated in FIG. 2B, since both the direct contact DC and the first impurity region SD1 have maximum widths in a same direction, e.g., a direction at an oblique angle with respect to edges of the substrate 101, an overlap area between the direct contact DC and the first impurity region SD1 may increase, e.g., the direct contact DC may completely cover and overlap the first impurity region SD1.

In some embodiments, unlike FIG. 2B, a direction in which the first impurity region SD1 has a maximum width may be different from a direction in which the direct contact DC has a maximum width. For example, the direction in which the first impurity region SD1 has a maximum width may intersect at a less angle with the first horizontal direction D1 than the third horizontal direction D3. As another example, the direction in which the first impurity region SD1 has a maximum width may intersect at a greater angle with the first horizontal direction D1 than the third horizontal direction D3.

In some embodiments, the direct contact DC may be arranged to have a maximum width in the third horizontal direction D3 intersecting with the first horizontal direction D1 and the second horizontal direction D2. For example, the direct contact DC may have an oval shape having a long axis extending in the third horizontal direction D3, as viewed in a top view.

Figure 3A:
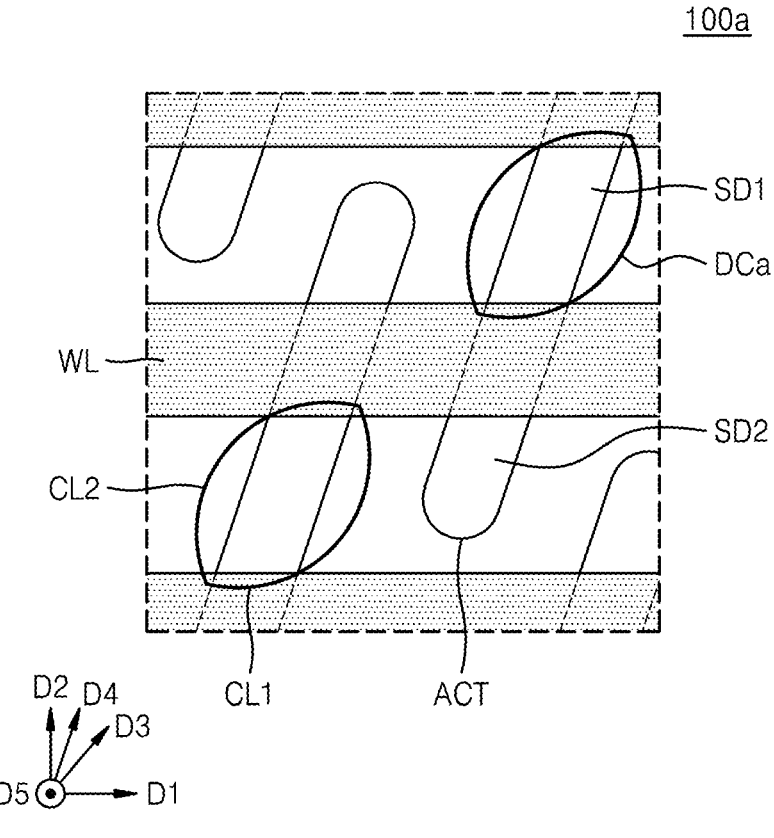
FIGS. 3A and 3B are magnified top views illustrating some components of semiconductor devices according to embodiments.
Figure 3B:
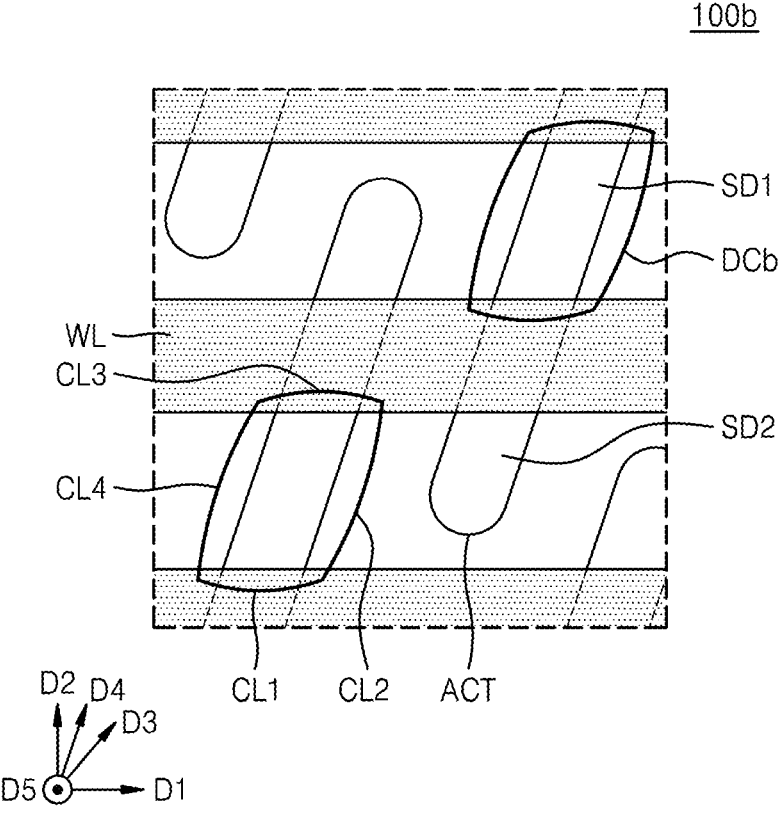

FIGS. 3A and 3B are magnified top views illustrating some components of semiconductor devices 100a and 100b according to embodiments.

Referring to FIG. 3A, the direct contact DC may have a shape having a long axis extending in the third horizontal direction D3 and including a first curve CL1 and a second curve CL2 recessed with respect to the long axis. In some embodiments, the direct contact DC may include the first curve CL1 and the second curve CL2 intersecting with each other at two points, and the two points of intersection may be two points on the long axis extending in the third horizontal direction D3. That is, a distance between the two points of intersection may be a maximum value among distances between random two points on the first curve CL1 and the second curve CL2.

In some embodiments, the first curve CL1 and the second curve CL2 may meet each other on the long axis with cusps. That is, the direct contact DC may not have a full oval shape but a shape distorted with two vertices.

Referring to FIG. 3B, the direct contact DC may have a shape having a long axis extending in the third horizontal direction D3 and including first to fourth curves CL1, CL2, CL3, and CL4 recessed with respect to the long axis. In some embodiments, the direct contact DC may have a shape including the first to fourth curves CL1, CL2, CL3, and CL4 intersecting with each other, and two points of intersection having a maximum distance therebetween among four points of intersection may be two points on the long axis extending in the third horizontal direction D3. That is, the maximum distance between the two points of intersection may be a maximum value among distances between random two points on the first to fourth curves CL1, CL2, CL3, and CL4.

In some embodiments, the first curve CL1 and the second curve CL2, the second curve CL2 and the third curve CL3, the third curve CL3 and the fourth curve CL4, and the fourth curve CL4 and the first curve CL1 may meet with a cusp, respectively. That is, the direct contact DC may not have a full oval shape but a shape distorted with four vertices. In some embodiments, the direct contact DC may have a similar shape to a parallelogram including four sides recessed with respect to a center of the parallelogram.

Figure 4A:
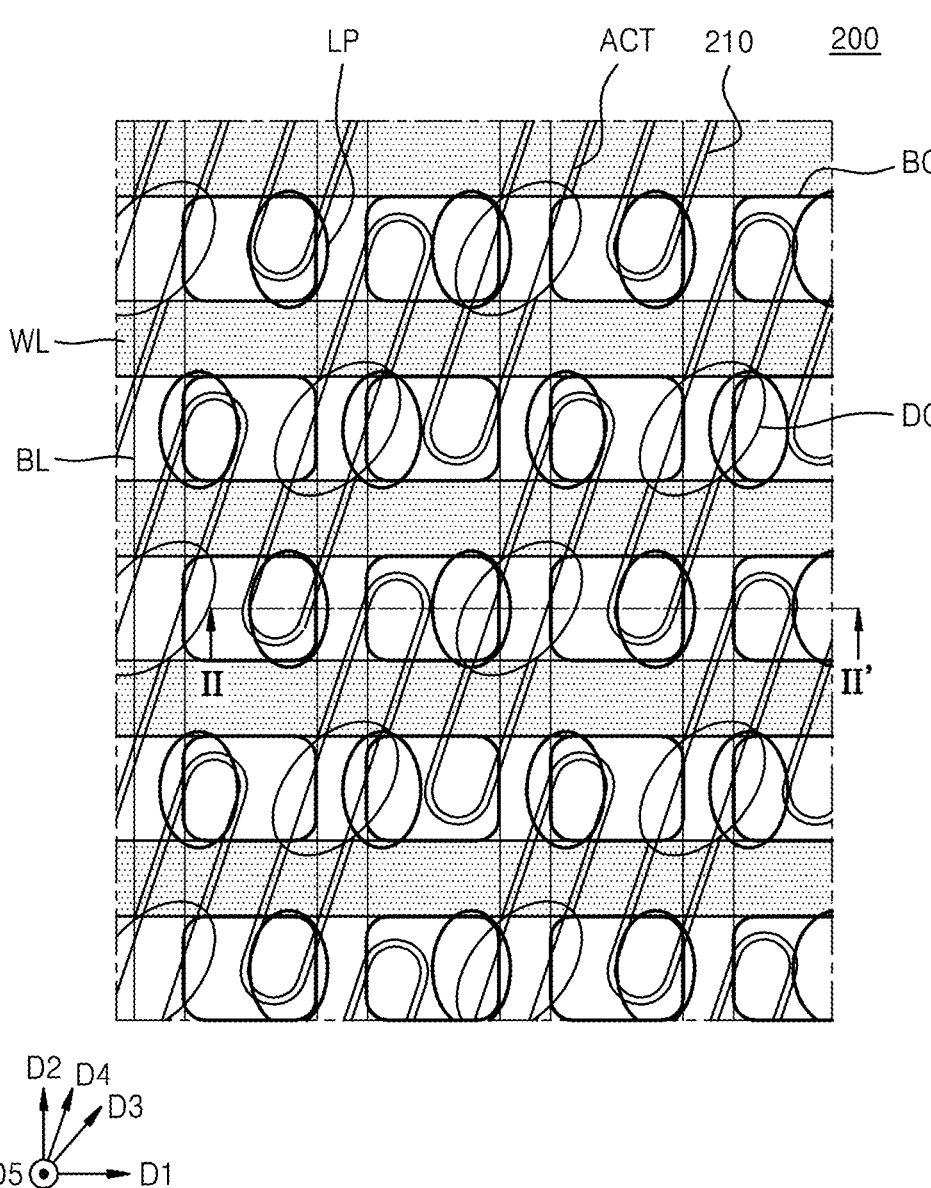
FIG. 4A is a layout diagram illustrating main components of a semiconductor device according to some embodiments.
Figure 4B:
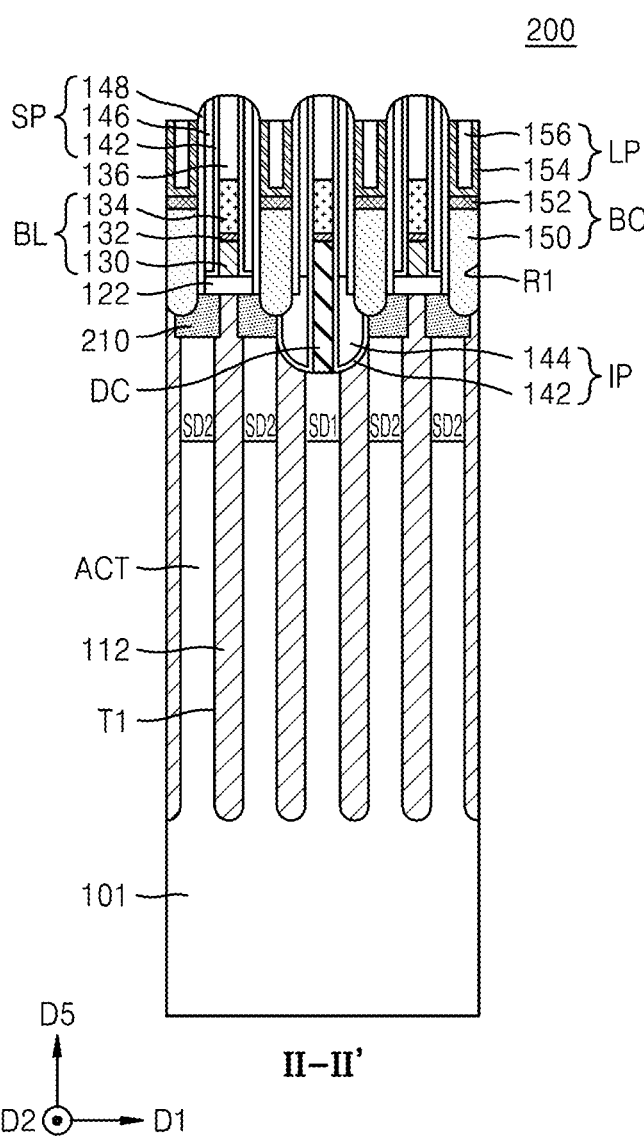
FIG. 4B is a cross-sectional view taken along line II-II' of FIG. 4A to describe the semiconductor device according to some embodiments.

FIG. 4A is a layout diagram illustrating main components of a semiconductor device 200 according to some embodiments. FIG. 4B is a cross-sectional view taken along line II-II' of FIG. 4A.

Referring to FIGS. 4A and 4B, the semiconductor device 200 having an extra pad 210 is provided. Hereinafter, differences relative to the semiconductor device 100 described with reference to FIGS. 1A and 1B are mainly described.

The plurality of active regions ACT may be arranged in a bar shape extending in the fourth horizontal direction D4 intersecting with the first horizontal direction D1 and the second horizontal direction D2. For example, as illustrated in FIGS. 4A and 4B, the extra pad 210 may have a greater horizontal width (e.g., in the first horizontal direction D1) than the active region ACT, and may be on each of the plurality of active regions ACT. In another example, the extra pad 210 may have a horizontal width not greater than that of the active region ACT.

In some embodiments, one direct contact DC and a pair of contact plugs 150 facing each other with the one direct contact DC therebetween may be electrically connected to different active regions ACT among the plurality of active regions ACT, respectively. That is, the contact plug 150 may be directly connected to the extra pad 210 by forming a contact surface therebetween, the extra pad 210 having a greater horizontal width than the active region ACT.

The contact plug 150 and the metal silicide layer 152 may constitute the buried contact BC. The contact plug 150, the metal silicide layer 152, and the landing pad LP sequentially disposed on the substrate 101 may constitute a contact structure electrically connected to the active region ACT via the extra pad 210 at a position adjacent to the bit line BL in the first horizontal direction D1.

In some embodiments, a level of the lowest surface of the contact plug 150 may be higher than a level of the lowest surface of the extra pad 210 and lower than a level of the highest surface of the extra pad 210. In addition, the level of the lowest surface of the contact plug 150 may be higher than a level of the highest surface of the active region ACT and lower than a level of the highest surface of the isolation layer 112. That is, the contact plug 150 may be electrically connected to the active region ACT via the extra pad 210 without being in direct contact with the active region ACT.

For example, the extra pad 210 may include a single-layer structure of doped polysilicon. In this case, the plurality of contact plugs 150 may be fully made of doped polysilicon.

In another example, the extra pad 210 may include a single-layer structure of a metal. In this case, the plurality of contact plugs 150 may be fully made of a metal.

In some embodiments, unlike FIGS. 4A and 4B, the extra pad 210 may have a stacked structure of a lower pad including doped polysilicon and an upper pad including a metal. Herein, the contact plug 150 may include a metal of substantially the same material as that of the upper pad. In some embodiments, the contact plug 150 may be in direct contact with the upper pad, and in this case, the contact plug 150 and the upper pad include the same material, and thus a contact resistance between the contact plug 150 and the upper pad may be very low.

In some embodiments, the extra pad 210 may further include a metal silicide layer between the lower pad and the upper pad. In addition, the contact plug 150 may further include a metal silicide layer along a contact surface with the upper pad.

In some embodiments, unlike FIGS. 4A and 4B, the extra pad 210 may have a less horizontal width than the active region ACT. In this case, the semiconductor device 200 may include the extra pad 210 disposed on the active region ACT and having a less horizontal width than the active region ACT, and an additional spacer formed on both side walls of the extra pad 210.

According to embodiments, the semiconductor device 100 (or 200) including the direct contact DC having a maximum width in the third horizontal direction D3 may be provided. In embodiments, by arranging the direct contact DC so as to have a maximum width in the third horizontal direction D3, a contact area between the direct contact DC and the first impurity region SD1 may increase. In embodiments, by arranging the direct contact DC so as to have a maximum width in the third horizontal direction D3, an electrical connection between the bit line BL and the active region ACT may be improved. Accordingly, a semiconductor device with improved performance and reliability may be provided.

FIGS. 5A to 13B are top views and cross-sectional views of stages in a method of manufacturing the semiconductor device 100, according to embodiments. In detail, FIGS. 5A, 6A, 7A, 8A, 9A, 10A, 11A, 12A, and 13A are top views showing only some components according to a process order to describe the method of manufacturing the semiconductor device 100. FIGS. 5B, 6B, 7B, 8B, 9B, 10B, 11B, 12B, and 13B are cross-sectional views taken along line of FIGS. 5A, 6A, 7A, 8A, 9A, 10A, 11A, 12A, and 13A, respectively, to describe the method of manufacturing the semiconductor device 100.

Figure 5A:
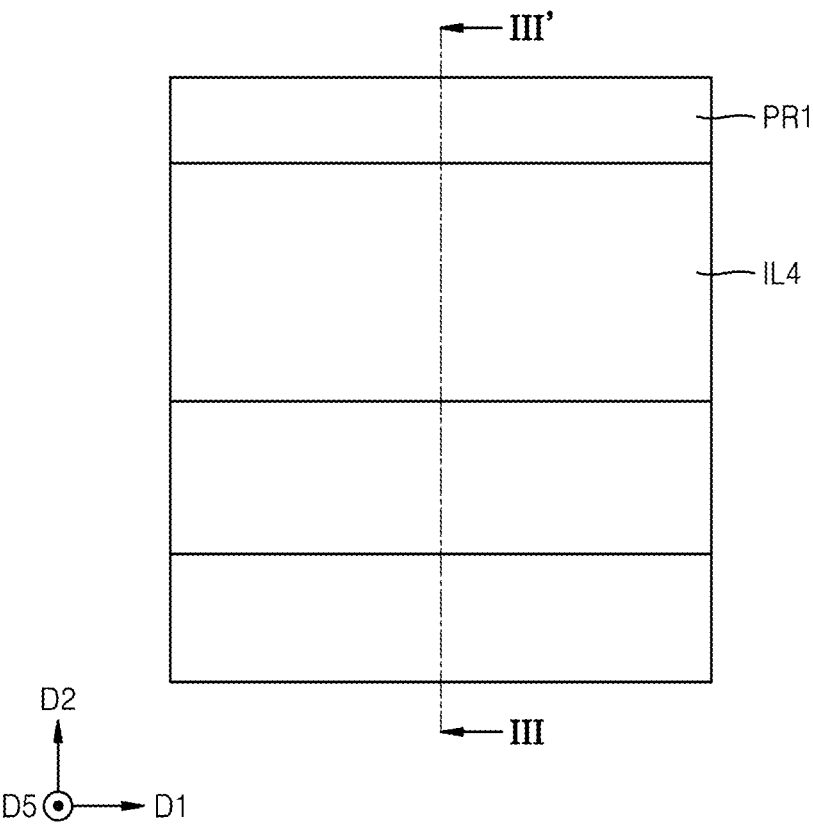
FIGS. 5A to 13B are top views and cross-sectional views of stages in a method of manufacturing a semiconductor device, according to embodiments.
Figure 5B:
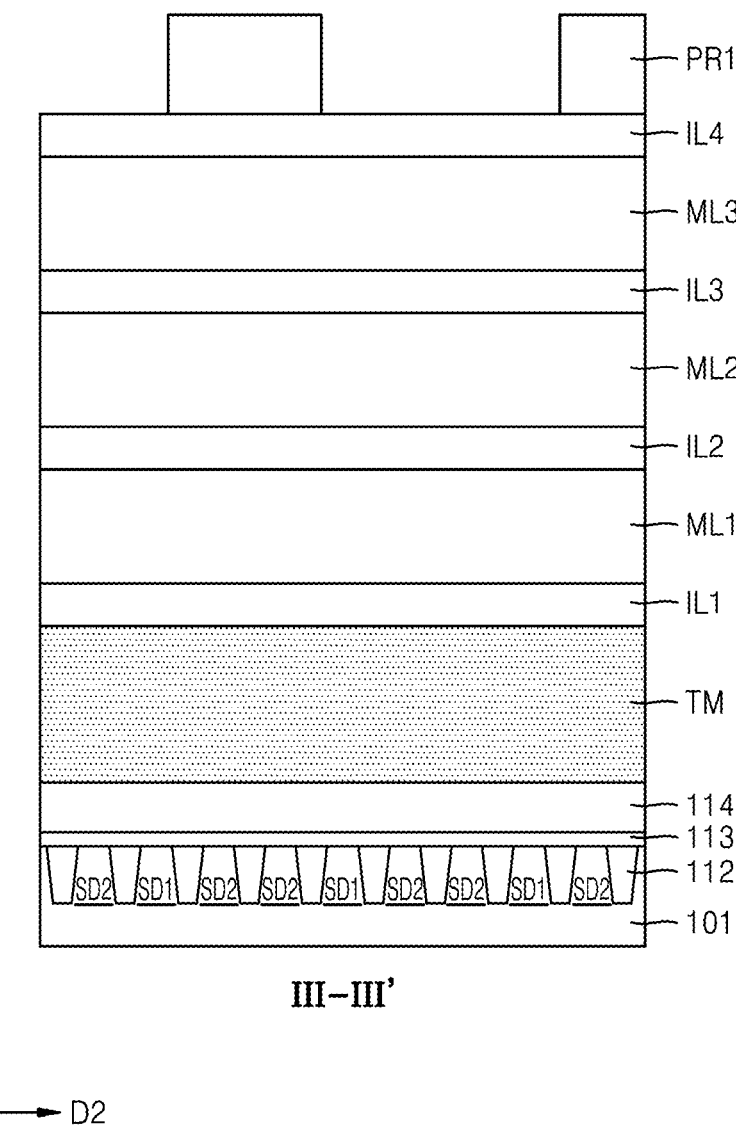

Referring to FIGS. 5A and 5B, the isolation layer 112 may be formed on the substrate 101. The active region ACT may be defined by the isolation layer 112. An impurity injection process may be performed on the active region ACT to form the first impurity region SD1 and a pair of second impurity regions SD2 on each active region ACT. The pair of second impurity regions SD2 may be separated from each other in a horizontal direction with the first impurity region SD1 therebetween. The first and second impurity regions SD1 and SD2 may be doped to have the same conductivity type (e.g., N type).

An insulating layer 113 and a polysilicon layer 114 may be formed on the substrate 101. The insulating layer 113 may include a plurality of insulating layers. The insulating layer 113 may include a silicon oxide layer, a silicon nitride layer, or a combination thereof. The polysilicon layer 114 may include a doped polysilicon layer. The insulating layer 113 may include the buffer layer 122 of FIG. 1B.

On the polysilicon layer 114, a target mask layer TM, a first insulating layer ILL a first mask layer ML1, a second insulating layer IL2, a second mask layer ML2, a third insulating layer IL3, a third mask layer ML3, and a fourth insulating layer IL4 may be sequentially formed. For example, as illustrated in FIG. 5B, a stack of alternating mask layers and insulating layers may be formed on the polysilicon layer 114.

The target mask layer TM may include a spin on hard-mask (SOH) layer. The target mask layer TM may further include a silicon oxide layer beneath the SOH layer. The first insulating layer IL1 may include a silicon nitride layer and/or a silicon oxynitride layer. The first mask layer ML1 may include an SOH layer. The second insulating layer IL2 may include a silicon nitride layer and/or a silicon oxynitride layer. The second mask layer ML2 may include an SOH layer. The third insulating layer IL3 may include a silicon nitride layer and/or a silicon oxynitride layer. The third mask layer ML3 may include an SOH layer. The fourth insulating layer IL4 may include a silicon nitride layer and/or a silicon oxynitride layer.

A first photoresist layer PR1 may be formed on the fourth insulating layer IL4. The first photoresist layer PR1 may be patterned using a first photomask.

Figure 6A:
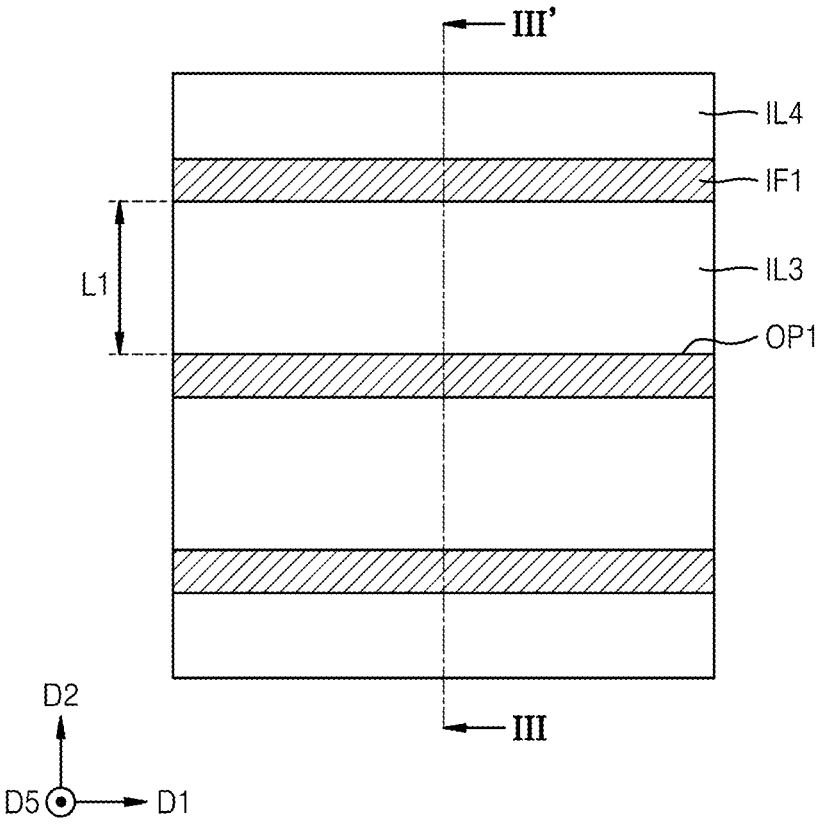
Figure 6B:
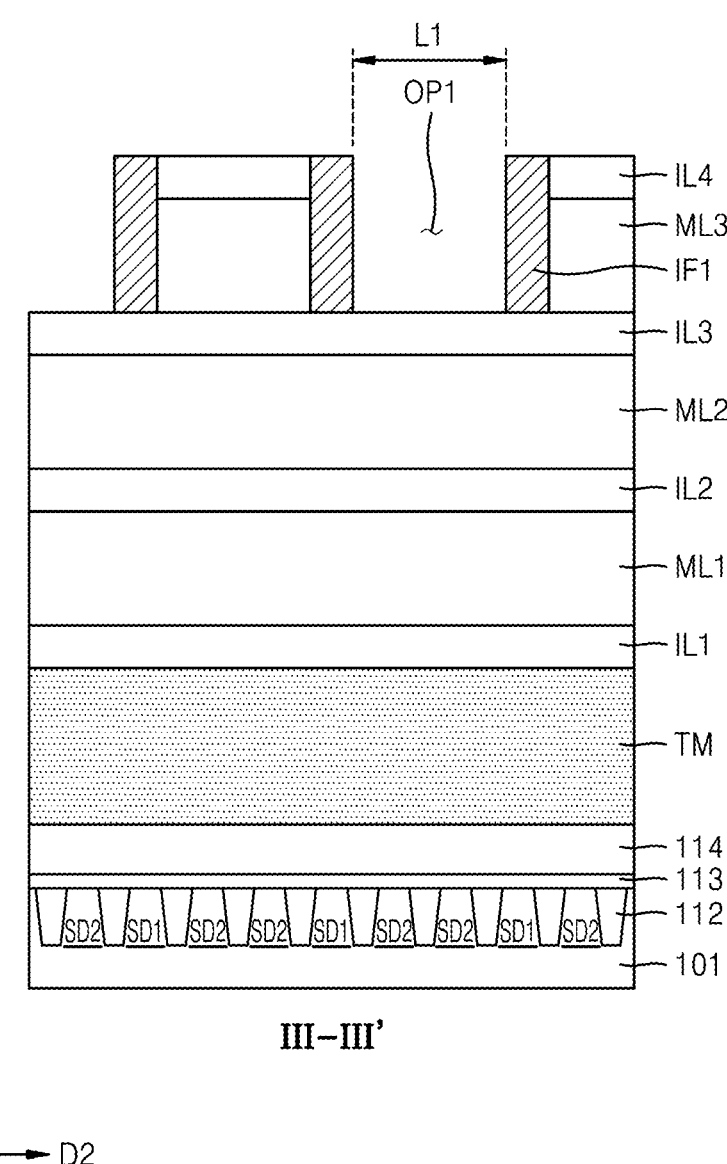

Referring to FIGS. 6A and 6B, a first opening OP1 may be formed by patterning the fourth insulating layer IL4 and the third mask layer ML3. The first opening OP1 may extend in a horizontal direction parallel to the upper surface of the substrate 101. For example, the first opening OP1 may extend in the first horizontal direction D1 like the word line WL. As another example, the first opening OP1 may extend in the second horizontal direction D2. That is, the first opening OP1 may extend in a direction intersecting with the word line WL. In the specification, although the first horizontal direction D1 or the second horizontal direction D2 is described as a direction in which the first opening OP1 is patterned, this is only illustrative, and the first opening OP1 may be patterned in another horizontal direction.

Forming the first opening OP1 may include patterning the fourth insulating layer IL4 and the third mask layer ML3 by using the patterned first photoresist layer PR1 on the fourth insulating layer IL4, as an etching mask. The first photoresist layer PR1 remaining thereafter may be removed.

A first insulating film IF1 may be conformally formed above a front, e.g., upper, surface of the substrate 101. The first insulating film IF1 may be formed on exposed side surfaces of the fourth insulating layer IL4 and the third mask layer ML3. The first insulating film IF1 may define the first opening OP1 together with the third insulating layer IL3, e.g., a width of the first opening OP1 between facing surfaces of the first insulating film IF1 in the second horizontal direction D2 may be L1. The third insulating layer IL3 may be exposed by the first opening OP1. The first insulating film IF1 may include a silicon oxide layer. The first insulating film IF1 may be formed by atomic layer deposition (ALD). After forming the first insulating film IF1, a first etch-back process may be performed. By the first etch-back process, a portion of the first insulating film IF1 on the fourth insulating layer IL4 and a portion of the first insulating film IF1 on the third insulating layer IL3 may be removed.

Figure 7A:
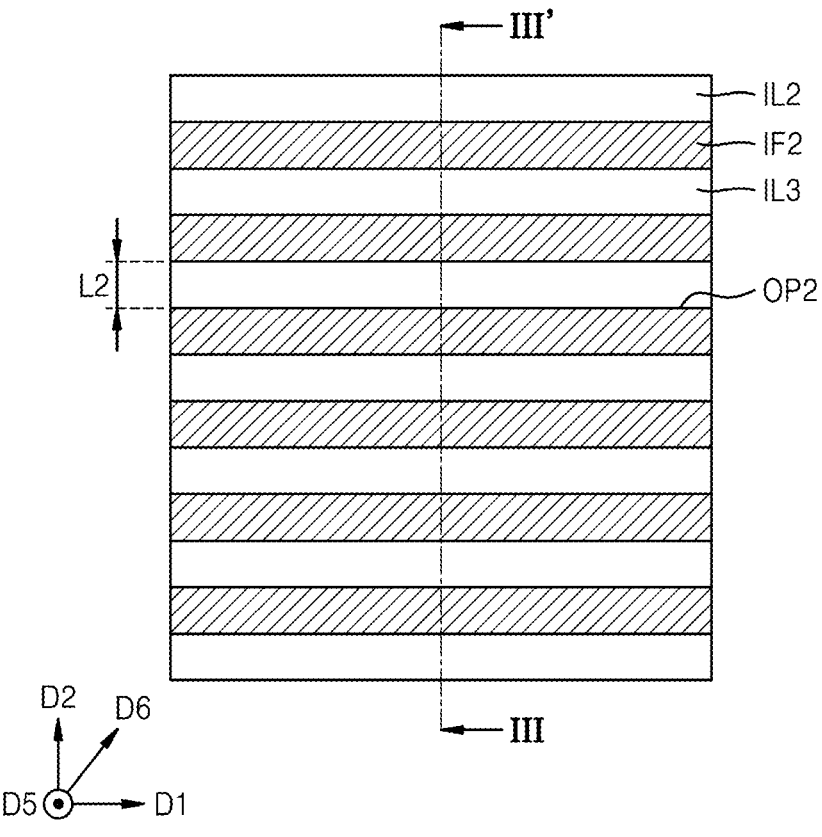
Figure 7B:
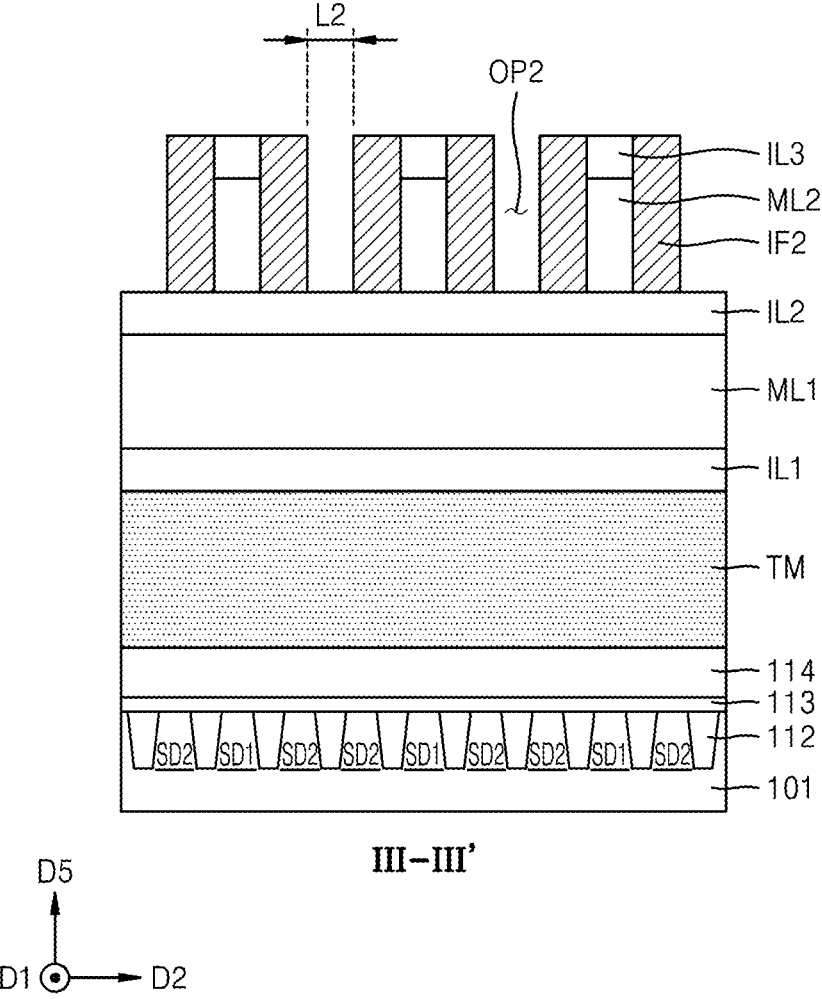

Referring to FIGS. 7A and 7B, a second opening OP2 may be formed by patterning the third insulating layer IL3 and the second mask layer ML2. The second opening OP2 may extend in a direction parallel to the first opening OP1. That is, the second opening OP2 may extend in a horizontal direction parallel to the upper surface of the substrate 101. For example, the second opening OP2 may extend in the first horizontal direction D1 like the word line WL. As another example, the second opening OP2 may extend in the second horizontal direction D2. That is, the second opening OP2 may extend in a direction intersecting with the word line WL. In embodiments, like the first opening OP1, the second opening OP2 may be patterned in a horizontal direction that is different from the first horizontal direction D1 and the second horizontal direction D2 and parallel to the first opening OP1.

In some embodiments, a width of the second opening OP2 may be less than a half of a width of the first opening OP1. In some embodiments, the width of the second opening OP2 may be about one third of the width of the first opening OP1. For example, referring to FIGS. 6A-7B, when the first opening OP1 and the second opening OP2 extend in the first horizontal direction D1, a width of the first opening OP1 in the second horizontal direction D2 may be L1 (see FIG. 6A), and a width of the second opening OP2 in the second horizontal direction D2 may be L2. In other words, the width L2 of the second opening OP2 in the second horizontal direction D2 may be about one third of the width L1 of the first opening OP1 in the second horizontal direction D2.

Forming the second opening OP2 may include removing the fourth insulating layer IL4 and the third mask layer ML3 by using the first insulating film IF1 on the third insulating layer IL3, as an etching mask, and patterning the third insulating layer IL3 and the second mask layer ML2. Thereafter, the first insulating film IF1 may be removed.

A second insulating film IF2 may be conformally formed above the front surface of the substrate 101. The second insulating film IF2 may be formed on exposed side surfaces of the third insulating layer IL3 and the second mask layer ML2. The second insulating film IF2 may define the second opening OP2 together with the second insulating layer IL2. The second insulating layer IL2 may be exposed by the second opening OP2. The second insulating film IF2 may include a silicon oxide layer. The second insulating film IF2 may be formed by ALD. After forming the second insulating film IF2, a second etch-back process may be performed. By the second etch-back process, a portion of the second insulating film IF2 on the third insulating layer IL3 and a portion of the second insulating film IF2 on the second insulating layer IL2 may be removed.

Figure 8A:
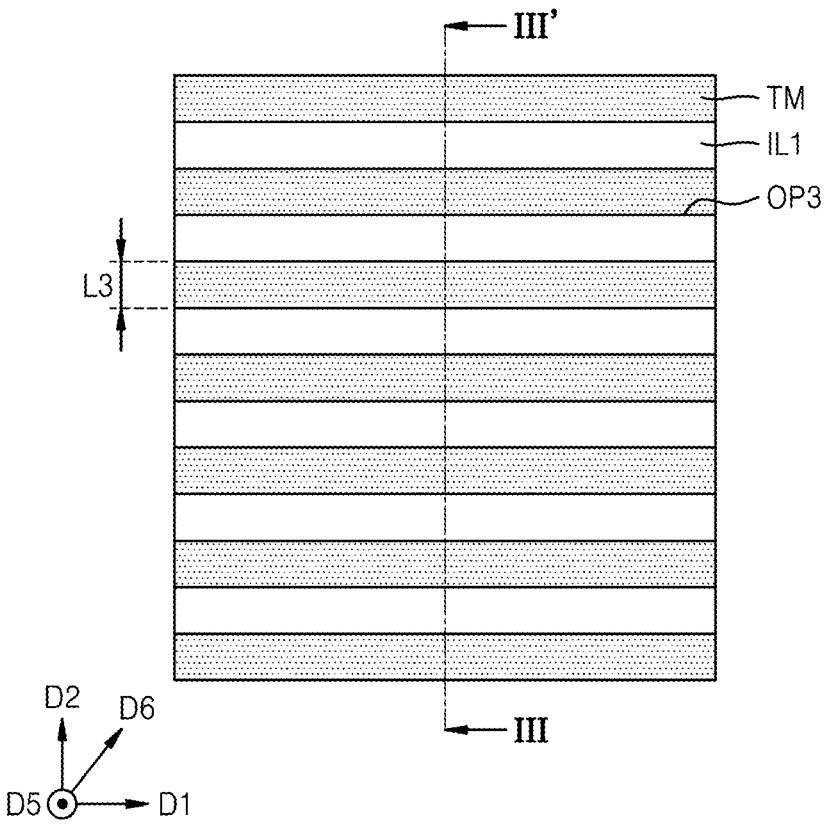
Figure 8B:
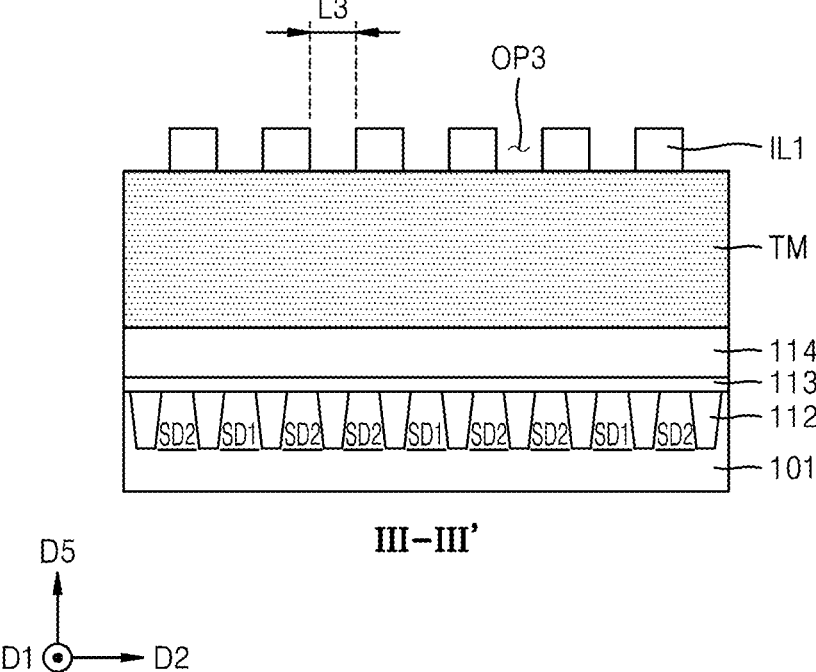

Referring to FIGS. 8A and 8B, a third opening OP3 may be formed by patterning the first insulating layer IL1. The third opening OP3 may extend in a direction parallel to the second opening OP2 and the first opening OP1. That is, the third opening OP3 may extend in a horizontal direction parallel to the upper surface of the substrate 101. For example, the third opening OP3 may extend in the first horizontal direction D1 like the word line WL. As another example, the third opening OP3 may extend in the second horizontal direction D2. That is, the third opening OP3 may extend in a direction intersecting with the word line WL. In embodiments, like the first opening OP1 and the second opening OP2, the third opening OP3 may be patterned in a horizontal direction that is different from the first horizontal direction D1 and the second horizontal direction D2 and parallel to the first opening OP1 and the second opening OP2. The target mask layer TM may be exposed by the third opening OP3.

In some embodiments, a width of the third opening OP3 may be substantially the same as the width of the second opening OP2. In some embodiments, the width of the third opening OP3 may be about one third of the width of the first opening OP1. For example, when the first opening OP1, the second opening OP2, and the third opening OP3 extend in the first horizontal direction D1, a width of the third opening OP3 in the second horizontal direction D2 may be L3. In other words, the width L3 of the third opening OP3 in the second horizontal direction D2 may be substantially the same as the width L2 of the second opening OP2 in the second horizontal direction D2 and about one third of the width L1 of the first opening OP1 in the second horizontal direction D2.

Forming the third opening OP3 may include removing the third insulating layer IL3 and the second mask layer ML2 by using the second insulating film IF2 on the second insulating layer IL2, as an etching mask, and patterning the second insulating layer IL2 and the first mask layer ML1. The first insulating layer IL1 may be patterned by using the second insulating layer IL2 and the first mask layer ML1 as an etching mask. In some embodiments, processes of patterning the second insulating layer IL2, the first mask layer ML1, and the first insulating layer IL1 may be simultaneously performed. Alternatively, the processes of patterning the second insulating layer IL2, the first mask layer ML1, and the first insulating layer IL1 may be sequentially performed. Thereafter, the second insulating layer IL2 and the first mask layer ML1 may be removed.

Referring to 9A and 9B, a fourth mask layer ML4, a fifth insulating layer IL5, a fifth mask layer ML5, and a sixth insulating layer IL6 may be sequentially formed on the target mask layer TM. The fourth mask layer ML4 may cover the patterned first insulating layer IL1. The fourth mask layer ML4 may fill the third openings OP3. Although the first insulating layer IL1 and the third opening OP3 are not shown in FIG. 9A due to being covered by the fourth mask layer ML4, the first insulating layer IL1 and the third opening OP3 are indicated by dashed lines in FIG. 9A for convenience of description.

The fourth mask layer ML4 may include an SOH layer. The fifth insulating layer IL5 may include a silicon nitride layer and/or a silicon oxynitride layer. The fifth mask layer ML5 may include an SOH layer. The sixth insulating layer IL6 may include a silicon nitride layer and/or a silicon oxynitride layer.

Figure 9A:
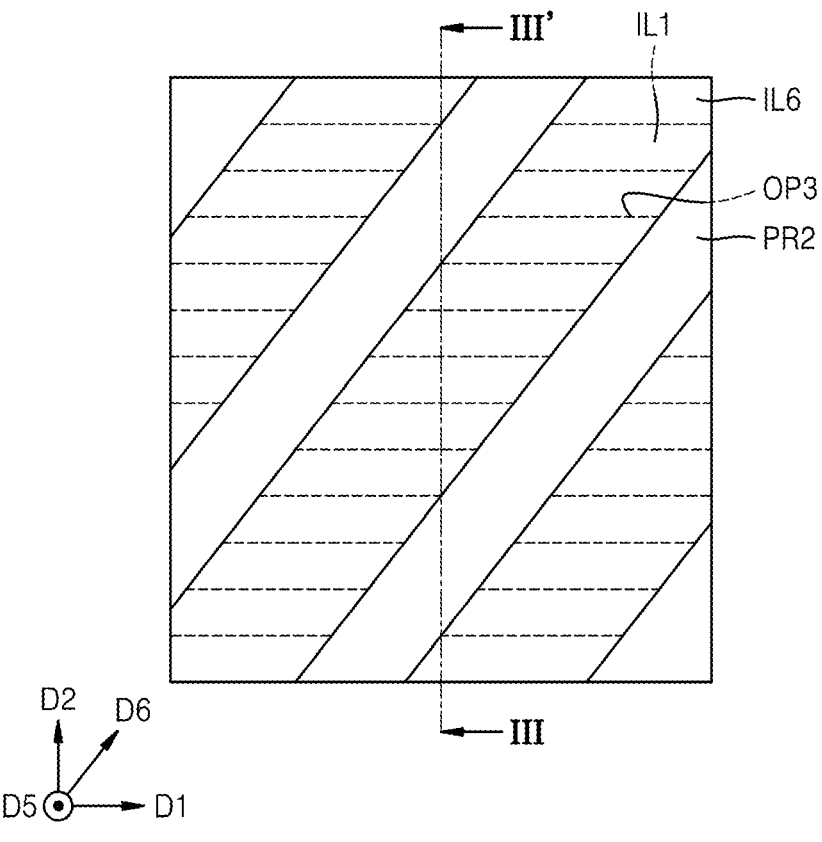
Figure 9B:
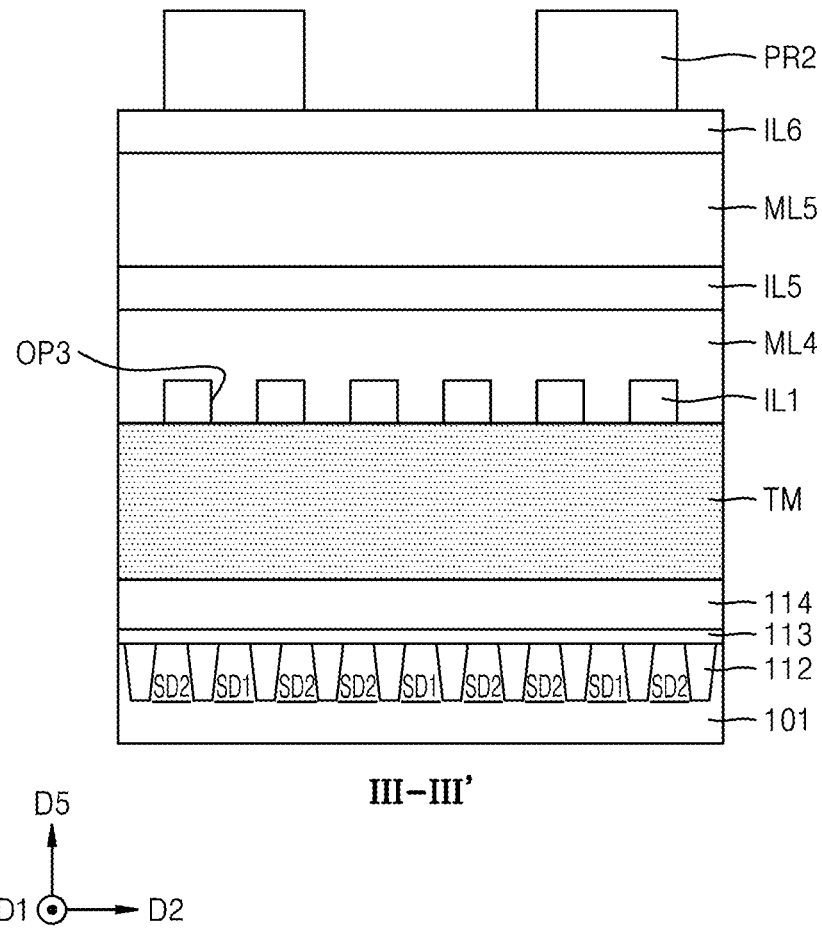

A second photoresist layer PR2 may be formed on the sixth insulating layer IL6. The second photoresist layer PR2 may be patterned using a second photomask. The patterned second photoresist layer PR2 may extend in a diagonal direction intersecting with the first horizontal direction D1 and the second horizontal direction D2. The patterned second photoresist layer PR2 may extend in a sixth horizontal direction D6, as illustrated in FIG. 9A. The sixth horizontal direction D6 may be selected so that the plurality of direct contacts DC have a long axis in the third horizontal direction D3, as described with reference to FIG. 1A. The sixth horizontal direction D6 may be the diagonal direction of FIG. 1A in which the plurality of direct contacts DC are separated from each other.

Figure 10A:
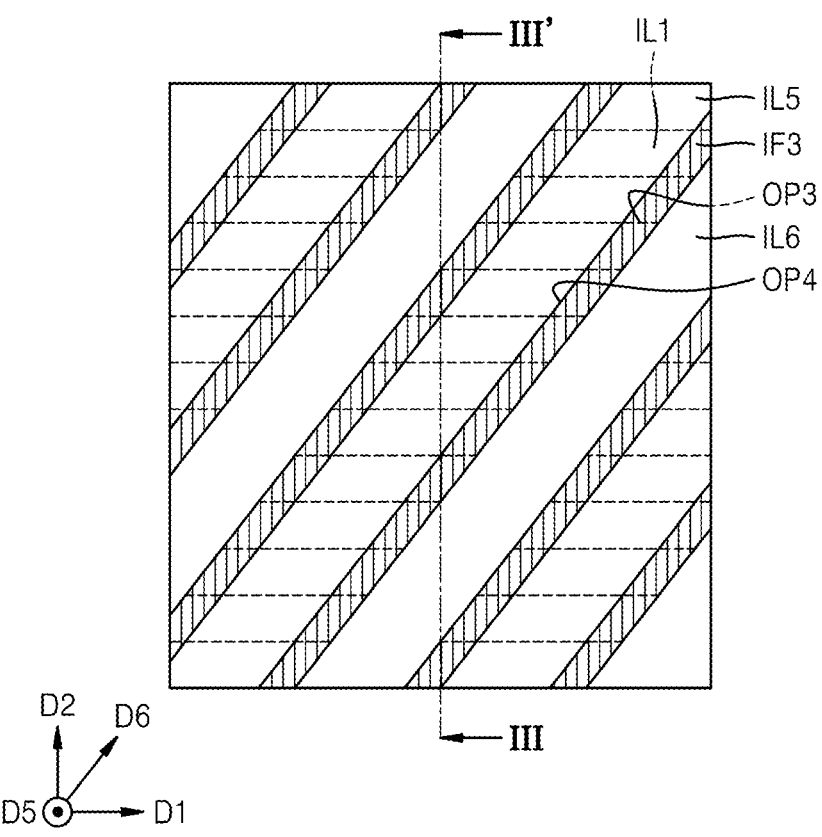
Figure 10B:
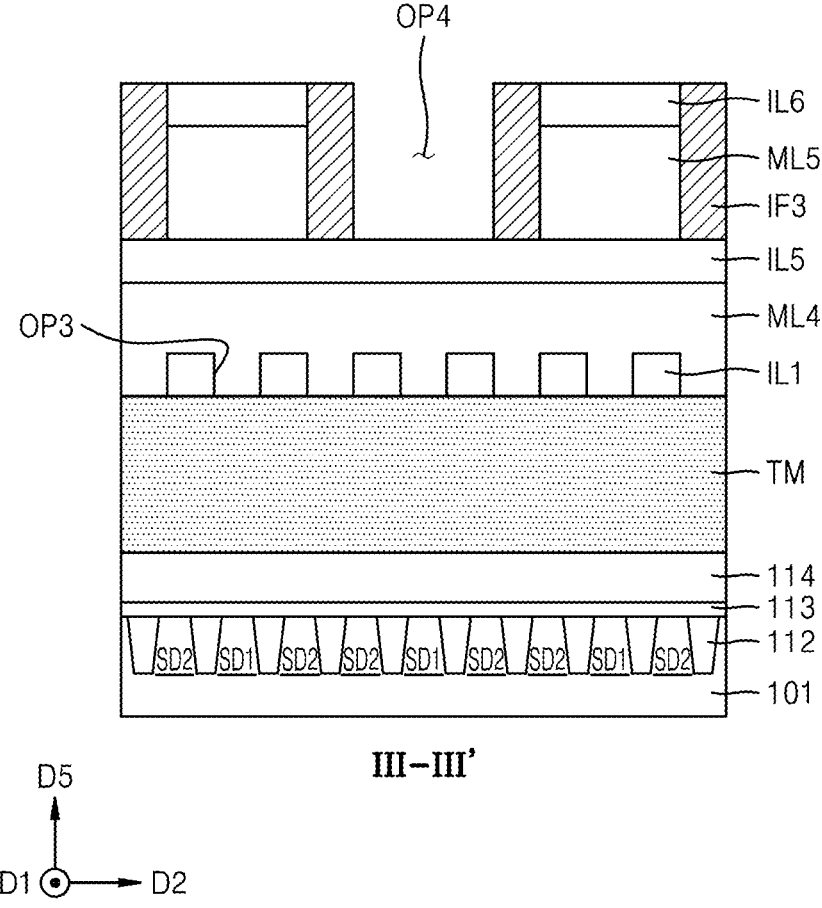

Referring to FIGS. 10A and 10B, a fourth opening OP4 may be formed by patterning the sixth insulating layer IL6 and the fifth mask layer ML5. The fourth opening OP4 may extend in a horizontal direction parallel to the upper surface of the substrate 101. For example, the fourth opening OP4 may extend in the sixth horizontal direction D6. Although the first insulating layer IL1 and the third opening OP3 are not shown by being covered by the fifth insulating layer IL5 and the fourth mask layer ML4, the first insulating layer IL1 and the third opening OP3 are indicated by dashed lines in FIG. 10A, for convenience of description.

Forming the fourth opening OP4 may include patterning the sixth insulating layer IL6 and the fifth mask layer ML5 by using the patterned second photoresist layer PR2 on the sixth insulating layer IL6, as an etching mask. The second photoresist layer PR2 remaining thereafter may be removed.

A third insulating film IF3 may be conformally formed above the front surface of the substrate 101. The third insulating film IF3 may be formed on exposed side surfaces of the sixth insulating layer IL6 and the fifth mask layer ML5. The third insulating film IF3 may define the fourth opening OP4 together with the fifth insulating layer IL5. The fifth insulating layer IL5 may be exposed by the fourth opening OP4. The third insulating film IF3 may include a silicon oxide layer. The third insulating film IF3 may be formed by ALD. After forming the third insulating film IF3, a third etch-back process may be performed. By the third etch-back process, a portion of the third insulating film IF3 on the sixth insulating layer IL6 and a portion of the third insulating film IF2 on the fifth insulating layer IL5 may be removed.

Figure 11A:
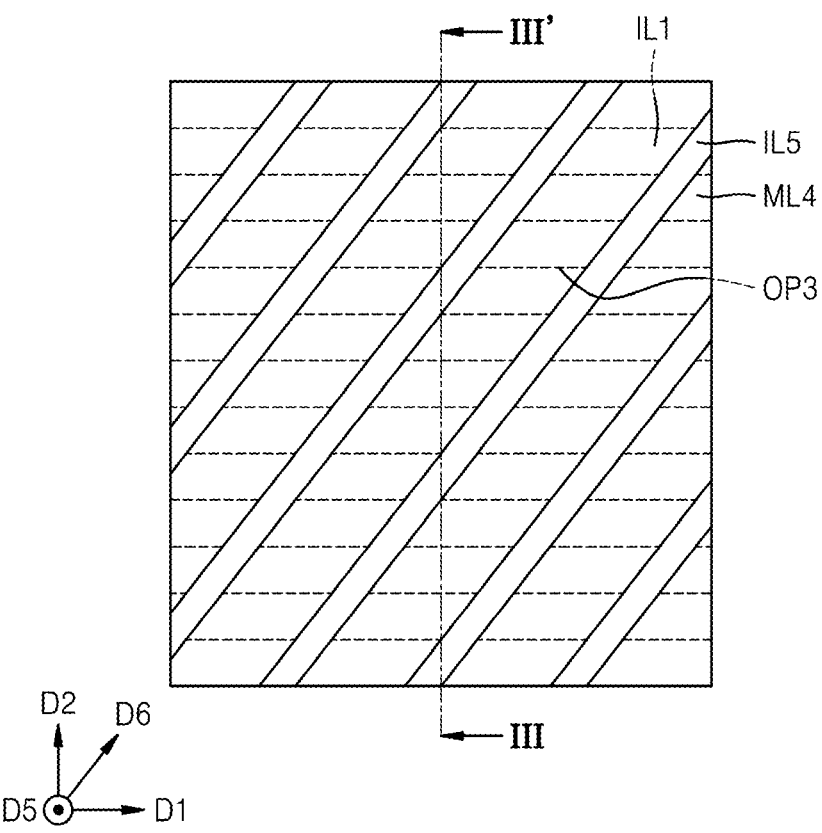
Figure 11B:
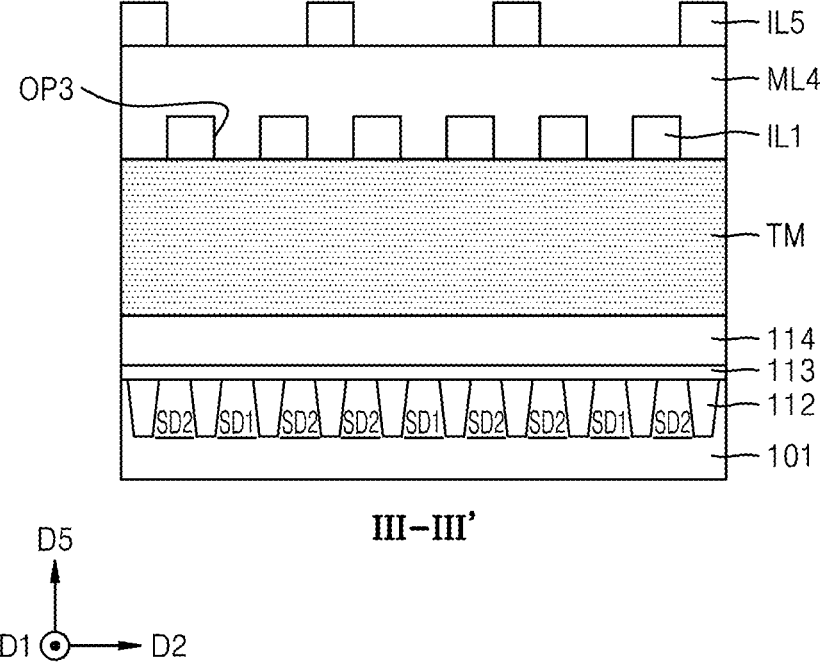

Referring to FIGS. 11A and 11B, the fifth insulating layer IL5 may be patterned. Patterning the fifth insulating layer IL5 may include removing the sixth insulating layer IL6 and the fifth mask layer ML5 by using the third insulating film IF3 on the fifth insulating layer IL5, as an etching mask, and patterning the fifth insulating layer IL5. In some embodiments, processes of patterning the sixth insulating layer IL6, the fifth mask layer ML5, and the fifth insulating layer IL5 may be simultaneously performed. Alternatively, the processes of patterning the sixth insulating layer IL6, the fifth mask layer ML5, and the fifth insulating layer IL5 may be sequentially performed. Although the first insulating layer IL1 and the third opening OP3 are not shown by being covered by the fourth mask layer ML4, the first insulating layer IL1 and the third opening OP3 are indicated by dashed lines for convenience of description.

Figure 12A:
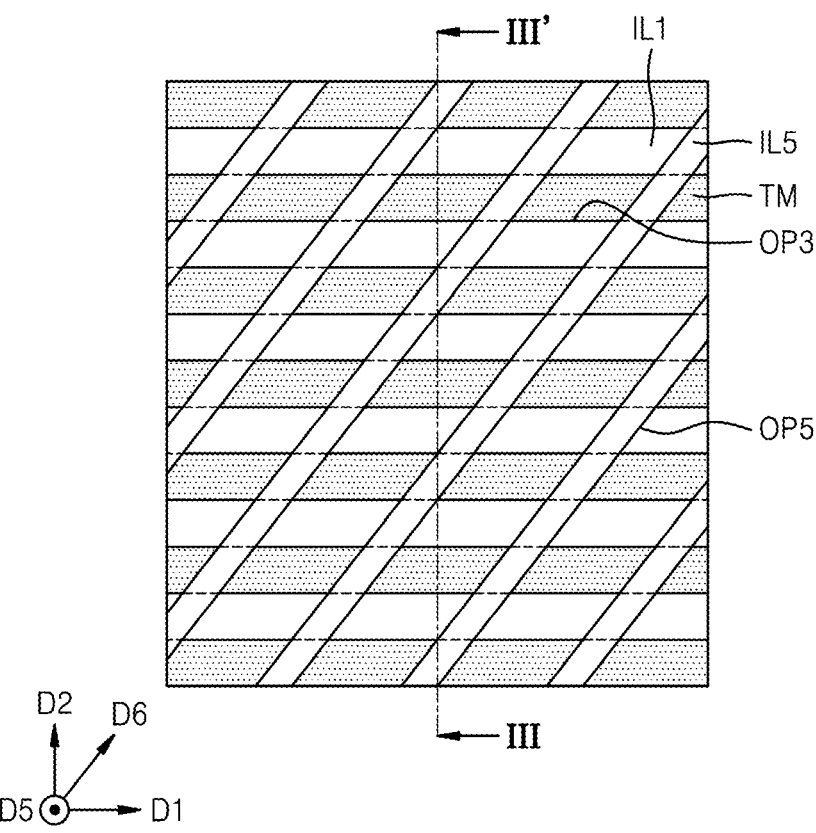
Figure 12B:
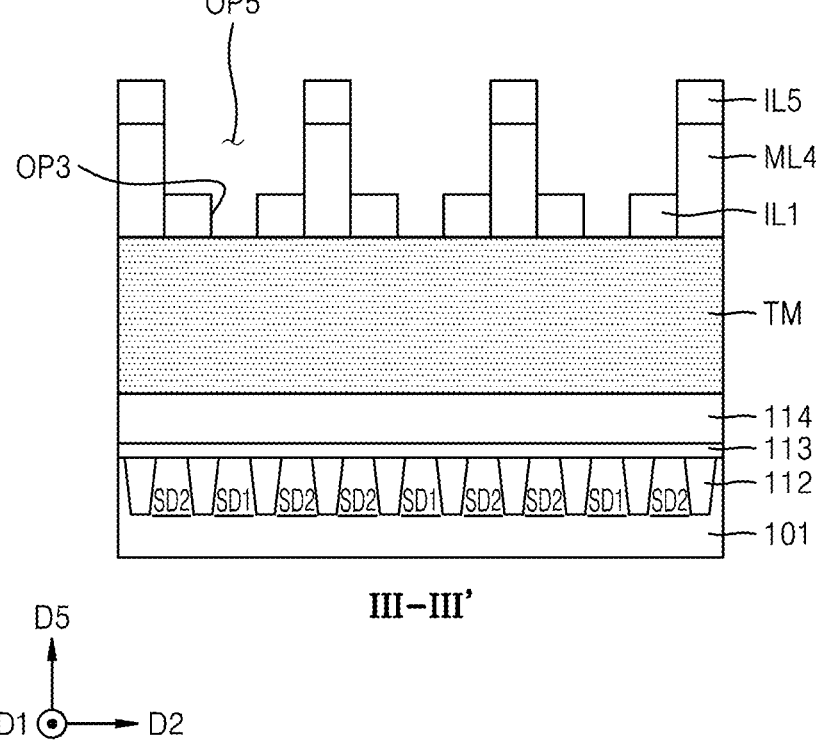

Referring to FIGS. 12A and 12B, a fifth opening OP5 may be formed by patterning the fourth mask layer ML4. The fifth opening OP5 may extend in a direction parallel to the fourth opening OP4. That is, the fifth opening OP5 may extend in a horizontal direction parallel to the upper surface of the substrate 101. For example, the fifth opening OP5 may extend in the sixth horizontal direction D6. For convenience of description, a portion of the first insulating layer IL1, which is not shown by being covered by the fifth insulating layer IL5, is indicated by a dashed line.

Forming the fifth opening OP5 may include removing a portion of the fourth mask layer ML4 by using the fifth insulating layer IL5 on the fourth mask layer ML4, as an etching mask, thereby exposing the first insulating layer IL1 through the fifth opening OP5. A portion of the fourth mask layer ML4 may be further removed by using the exposed first insulating layer IL1 as an etching mask. By further removing the portion of the fourth mask layer ML4, by using the exposed first insulating layer IL1 as an etching mask, the third opening OP3 may be exposed again. By exposing the third opening OP3, the target mask layer TM may be exposed.

In some embodiments, the exposed target mask layer TM may have a parallelogram shape in a top view, as illustrated in FIG. 12A (e.g., dotted portions between layers IL1 and IL5). This may be because the first insulating layer IL1 has been patterned in the first horizontal direction D1 and the fifth insulating layer IL5 has been patterned in the sixth horizontal direction D6 that is a diagonal direction intersecting with the first horizontal direction D1.

Figure 13A:
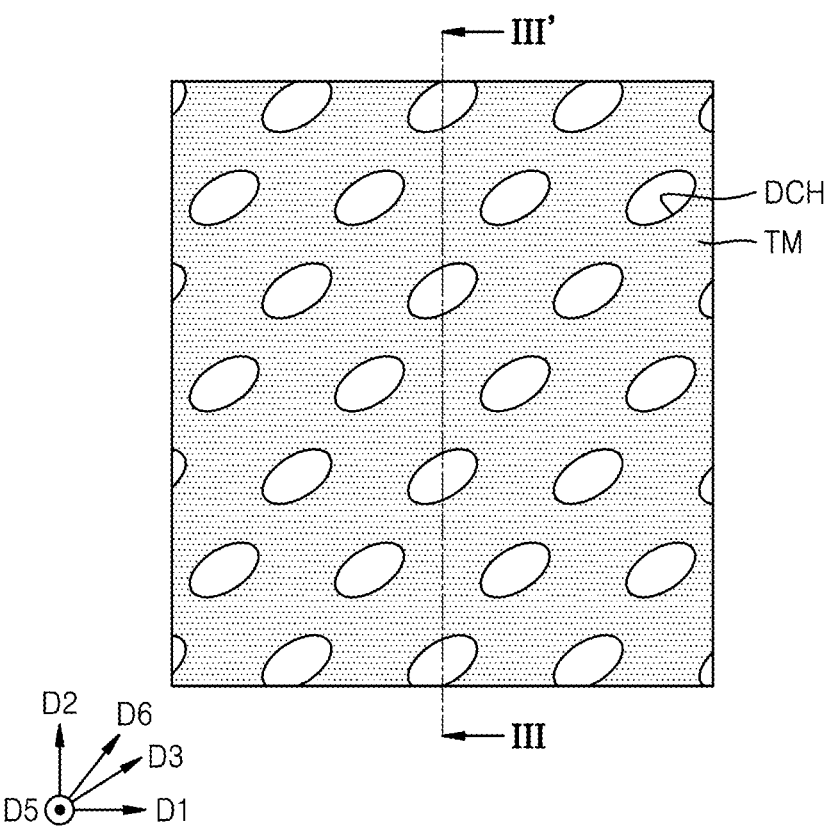
Figure 13B:
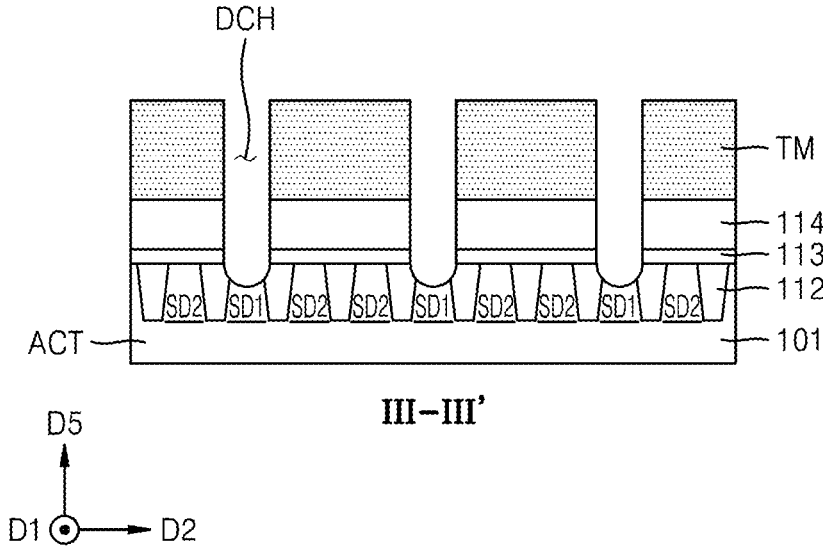

Referring to FIGS. 13A and 13B, a plurality of direct contact holes DCH may be formed by patterning the target mask layer TM. The active region ACT of the substrate 101 may be exposed through the direct contact hole DCH. In detail, the first impurity region SD1 of the substrate 101 may be exposed through the direct contact hole DCH.

Patterning the target mask layer TM may include patterning the target mask layer TM exposed through the fifth opening OP5 and the third opening OP3. In detail, patterning the target mask layer TM may include patterning the target mask layer TM by using, as an etching mask, the fifth insulating layer IL5 extending in the sixth horizontal direction D6 and the first insulating layer IL1 extending in the first horizontal direction D1, e.g., etching the exposed parallelogram shape of the target mask layer TM.

As illustrated in FIG. 13A, unlike the parallelogram shape of the exposed target mask layer in FIGS. 12A, a resultant etched shape of the direct contact hole DCH formed by patterning the target mask layer TM may not be a parallelogram with straight lines, but a shape close to a smoothed parallelogram, e.g., with curved lines. For example, due to the etching process, the resultant etched shape of the direct contact hole DCH may be closer to an oval or a distorted oval shape (e.g., a distorted oval shape with vertices illustrate in FIGS. 3A and 3B). Specifically, etching may not be completely performed on a vertex of the parallelogram shape and a portion adjacent thereto. Accordingly, since etching is not performed on the portion, a direct contact hole having a smooth parallelogram shape may be formed.

In some embodiments, the direct contact hole DCH may have a shape extending lengthwise (e.g., having a longitudinal direction) in the third horizontal direction D3. That is, the direct contact hole DCH may have a maximum width in the third horizontal direction D3. For example, the direct contact hole DCH may have an oval shape having a long axis extending in the third horizontal direction D3. For example, the direct contact hole DCH may have a shape having a long axis extending in the third horizontal direction D3 and including the first curve CL1 and the second curve CL2 recessed with respect to the long axis (FIG. 3A). As another example, the direct contact hole DCH may have a shape having a long axis extending in the third horizontal direction D3 and including the first to fourth curves CL1, CL2, CL3, and CL4 recessed with respect to the long axis (FIG. 3B). That is, the direct contact hole DCH may have a shape formed by smoothing four vertices of a parallelogram.

In some embodiments, the plurality of direct contact holes DCH may be separated from each other in the sixth horizontal direction D6.

In some embodiments, the sixth horizontal direction D6 intersecting at an acute angle with the first horizontal direction D1 and the second horizontal direction D2 may intersect at a greater angle with the first horizontal direction D1 than the third horizontal direction D3. In some embodiments, unlike shown in FIG. 13A, the sixth horizontal direction D6 may intersect at a smaller angle with the first horizontal direction D1 than the third horizontal direction D3. In some embodiments, the sixth horizontal direction D6 may be parallel to the third horizontal direction D3.

A subsequent process of manufacturing the semiconductor device 100 would be obvious to those of ordinary skill in the art, and thus, a detailed description thereof is omitted herein.

As shown in FIGS. 1A, 1B, and 5A to 13B, the semiconductor device 100 may include the direct contact DC, which may be formed by quadruple patterning and diagonal patterning, thereby reducing misalignment between direct contacts DC. Particularly, the plurality of direct contact holes DCH may be formed at one time, e.g., simultaneously, by patterning the target mask layer TM (see FIG. 13A) by quadruple patterning and diagonal patterning, thereby reducing misalignment which may occur between the plurality of direct contact holes DCH.

Figure 14:
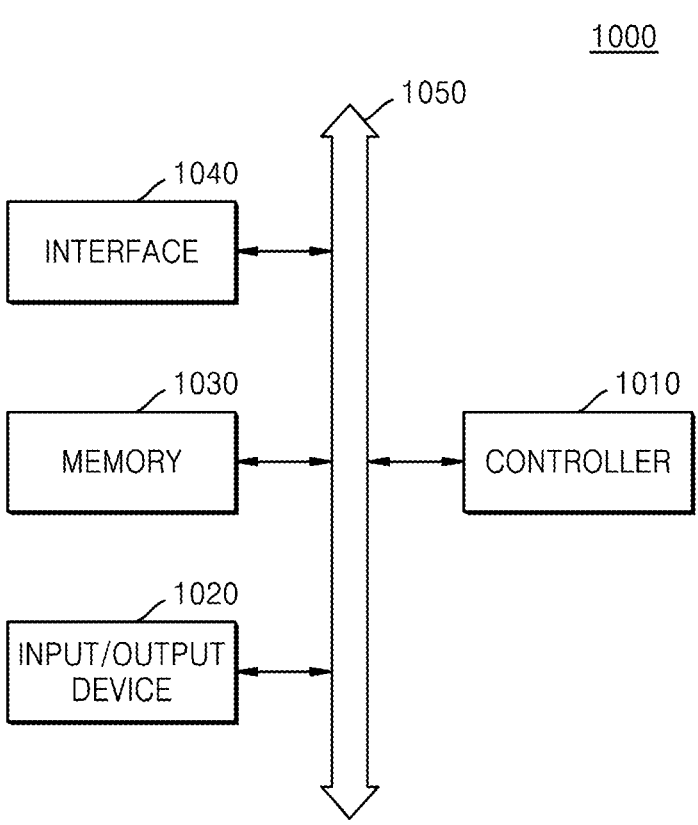
FIG. 14 is a block diagram illustrating a system including a semiconductor device according to embodiments.

FIG. 14 is a block diagram illustrating a system 1000 including a semiconductor device according to embodiments.

Referring to FIG. 14, the system 1000 may include a controller 1010, an input/output device 1020, a memory 1030, an interface 1040, and a bus 1050. The system 1000 may be a mobile system or a system for transmitting or receiving information. In some embodiments, the mobile system may be, e.g., a portable computer, a web tablet, a mobile phone, a digital music player, or a memory card.

The controller 1010 may control an execution program in the system 1000. For example, the controller 1010 may include a microprocessor, a digital signal processor, a micro-controller, or a similar device.

The input/output device 1020 may be used for the system 1000 to input or output data. The system 1000 may use the input/output device 1020 to be connected to an external device, e.g., a personal computer or a network, and exchange data with the external device. The input/output device 1020 may include, e.g., a touch screen, a touch pad, a keyboard, or a display.

The memory 1030 may store data for an operation of the controller 1010 or store data processed by the controller 1010. The memory 1030 may include any one of the semiconductor devices 100, 100a, 100b, and 200 according to embodiments.

The interface 1040 may be a data transmission passage between the system 1000 and an external device. The controller 1010, the input/output device 1020, the memory 1030, and the interface 1040 may communicate with each other via the bus 1050.

By way of summation and review, embodiments provide a semiconductor device with improved performance and reliability. That is, embodiments provide a semiconductor device having a direct contact (DC) which connects a bit line to an active region and has an elongated shape, e.g., an oval shape, extending in a diagonal direction with respect to edge of a substrate. The direct contact is formed to overlap, e.g., fully cover and extend beyond, an impurity region in a center of the active region, thereby increasing a contact area between the direct contact and the impurity region. In addition, the direct contact may be patterned one time, thereby reducing misalignment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate having at least one active region, the at least one active region being defined by an isolation layer;
at least one word line extending in a first horizontal direction inside the substrate, the at least one word line crossing the at least one active region;
at least one bit line extending in a second horizontal direction orthogonal to the first horizontal direction, the at least one bit line being at a higher vertical level than the at least one word line; and
at least one direct contact electrically connecting the at least one bit line to the at least one active region, the at least one direct contact having a maximum width in a third horizontal direction, the third horizontal direction intersecting each of the first horizontal direction and the second horizontal direction at an acute angle.

2. The semiconductor device as claimed in claim 1, wherein the at least one direct contact has an oval shape having a long axis extending in the third horizontal direction.

3. The semiconductor device as claimed in claim 1, wherein the at least one direct contact has a long axis extending in the third horizontal direction, a shape of the at least one direct contact including a first curve and a second curve recessed with respect to the long axis.

4. The semiconductor device as claimed in claim 3, wherein the first curve and the second curve meet on the long axis with a cusp.

5. The semiconductor device as claimed in claim 3, wherein the shape of the at least one direct contact further includes a third curve and a fourth curve recessed with respect to the long axis.

6. The semiconductor device as claimed in claim 1, wherein:
the third horizontal direction makes a first angle with the first horizontal direction, and
the at least one active region extends in a fourth horizontal direction intersecting at an acute angle with each of the first horizontal direction and the second horizontal direction, the fourth horizontal direction making a second angle greater than the first angle with the first horizontal direction.

7. The semiconductor device as claimed in claim 1, wherein:
the at least one active region includes a first impurity region and second impurity regions, the second impurity regions being separated from each other by the first impurity region, and
the at least one direct contact is electrically connected to the first impurity region, the first impurity region having a maximum width in the third horizontal direction.

8. The semiconductor device as claimed in claim 1, further comprising an extra pad on the at least one active region, the extra pad being electrically connected to the at least one active region.

9. The semiconductor device as claimed in claim 1, further comprising an additional direct contact separated from the at least one direct contact in a diagonal direction intersecting with the first horizontal direction and the second horizontal direction at an acute angle.

10. A semiconductor device, comprising:
a substrate;
an isolation layer defining an active region in the substrate;
a word line crossing the active region in a first horizontal direction, the word line dividing the active region into a first impurity region and a second impurity region;
a bit line extending on the substrate in a second horizontal direction orthogonal to the first horizontal direction; and
a direct contact electrically connecting the bit line to the first impurity region, the direct contact having a long axis extending in a third horizontal direction intersecting with the first horizontal direction and the second horizontal direction, and a shape of the direct contact includes a first curve and a second curve that meet on the long axis.

11. The semiconductor device as claimed in claim 10, wherein the shape of the direct contact is an oval shape.

12. The semiconductor device as claimed in claim 10, wherein the first curve and the second curve are recessed with respect to the long axis.

13. The semiconductor device as claimed in claim 10, wherein the first curve and the second curve have a cusp on the long axis.

14. The semiconductor device as claimed in claim 10, wherein the shape of the direct contact further includes a third curve and a fourth curve, the first to fourth curves being recessed with respect to the long axis.

15. The semiconductor device as claimed in claim 14, wherein the first curve and the second curve, the second curve and the third curve, the third curve and the fourth curve, and the fourth curve and the first curve meet with a cusp, respectively.

16. A semiconductor device, comprising:

a substrate;

an isolation layer in the substrate;

active regions defined by the isolation layer, each of the active regions including a first impurity region and second impurity regions, the second impurity regions being separated from each other by the first impurity region;

word lines extending in a first horizontal direction inside the substrate, each of the word lines crossing between the first impurity region and one of the second impurity regions;

bit lines extending in a second horizontal direction orthogonal to the first horizontal direction, the bit lines being at a higher vertical level than the word lines; and direct contacts electrically connecting the bit lines to the first impurity regions, each of the direct contacts having a maximum width in a third horizontal direction intersecting with each of the first horizontal direction and the second horizontal direction at an acute angle, wherein the first impurity region has a maximum width in the third horizontal direction.

17. The semiconductor device as claimed in claim 16, wherein each of the direct contacts has an oval shape having a long axis extending in the third horizontal direction.

18. The semiconductor device as claimed in claim 16, wherein the active regions extend in a fourth horizontal direction intersecting at an acute angle with the first horizontal direction and the second horizontal direction.

19. The semiconductor device as claimed in claim 18, wherein the third horizontal direction makes a first angle with the first horizontal direction, and the fourth horizontal direction makes a second angle greater than the first angle with the first horizontal direction.

20. The semiconductor device as claimed in claim 16, wherein the direct contacts are separated from each other in a diagonal direction intersecting with the first horizontal direction and the second horizontal direction at an acute angle.

* * * * *